(12) United States Patent
Vasudevan

(10) Patent No.: US 7,667,489 B1
(45) Date of Patent: Feb. 23, 2010

(54) POWER-ON RESET CIRCUIT FOR A VOLTAGE REGULATOR HAVING MULTIPLE POWER SUPPLY VOLTAGES

(75) Inventor: Narasimhan Vasudevan, Los Angeles, CA (US)

(73) Assignee: Xilinx, Inc., San Jose, CA (US)

( * ) Notice: Subject to any disclaimer, the term of this patent is extended or adjusted under 35 U.S.C. 154(b) by 147 days.

(21) Appl. No.: 11/977,831

(22) Filed: Oct. 26, 2007

(51) Int. Cl.
*H03K 19/00* (2006.01)
*H03K 19/02* (2006.01)
*H03K 19/096* (2006.01)

(52) U.S. Cl. .................. 326/57; 326/56; 326/58; 326/93; 326/94; 326/95; 326/96; 326/97; 326/98

(58) Field of Classification Search ............ 326/93–98, 326/56–59
See application file for complete search history.

(56) References Cited

U.S. PATENT DOCUMENTS

| | | | |
|---|---|---|---|
| 5,216,289 A * | 6/1993 | Hahn et al. ................. | 327/108 |
| 5,786,724 A | 7/1998 | Teggatz | |
| 6,653,751 B1 | 11/2003 | Teh Lo | |
| 7,046,074 B2 * | 5/2006 | Jang ........................... | 327/534 |
| 7,215,043 B2 | 5/2007 | Tsai et al. | |
| 7,265,605 B1 | 9/2007 | Vasudevan | |
| 2004/0084966 A1 | 5/2004 | Yarbrough | |
| 2004/0140719 A1 | 7/2004 | Vulih et al. | |
| 2005/0146230 A1 | 7/2005 | Tsai et al. | |
| 2007/0069807 A1 | 3/2007 | Ho | |
| 2008/0174181 A1 | 7/2008 | Kuo | |

OTHER PUBLICATIONS

U.S. Appl. No. 11/977,863, filed Oct. 26, 2007, Vasudevan.
U.S. Appl. No. 11/978,010, filed Oct. 26, 2007, Vasudevan.

* cited by examiner

*Primary Examiner*—Vibol Tan
*Assistant Examiner*—Matthew C Tabler
(74) *Attorney, Agent, or Firm*—W. Eric Webostad; Thomas George

(57) ABSTRACT

A voltage regulator and method of voltage regulation for a power-on reset condition are described. Voltage regulation control signals responsive to the power-on reset condition are obtained. The control signals are generated with a first voltage to be associated with a second voltage to provide a first power-on-reset signal and a second power-on-reset signal which are opposite in state to one another. A portion of driver logic is tri-stated responsive to the control signals, and the second power-on-reset signal to at least impede supply to supply current leakage. Voltage is pulled up on a first output port and a second output port of the driver logic responsive to the first power-on-reset signal. A portion of a semiconductor substrate is electrically coupled to a higher one of a first voltage and a second voltage responsive to the pulling up to at least further impede the supply to supply current leakage.

8 Claims, 9 Drawing Sheets

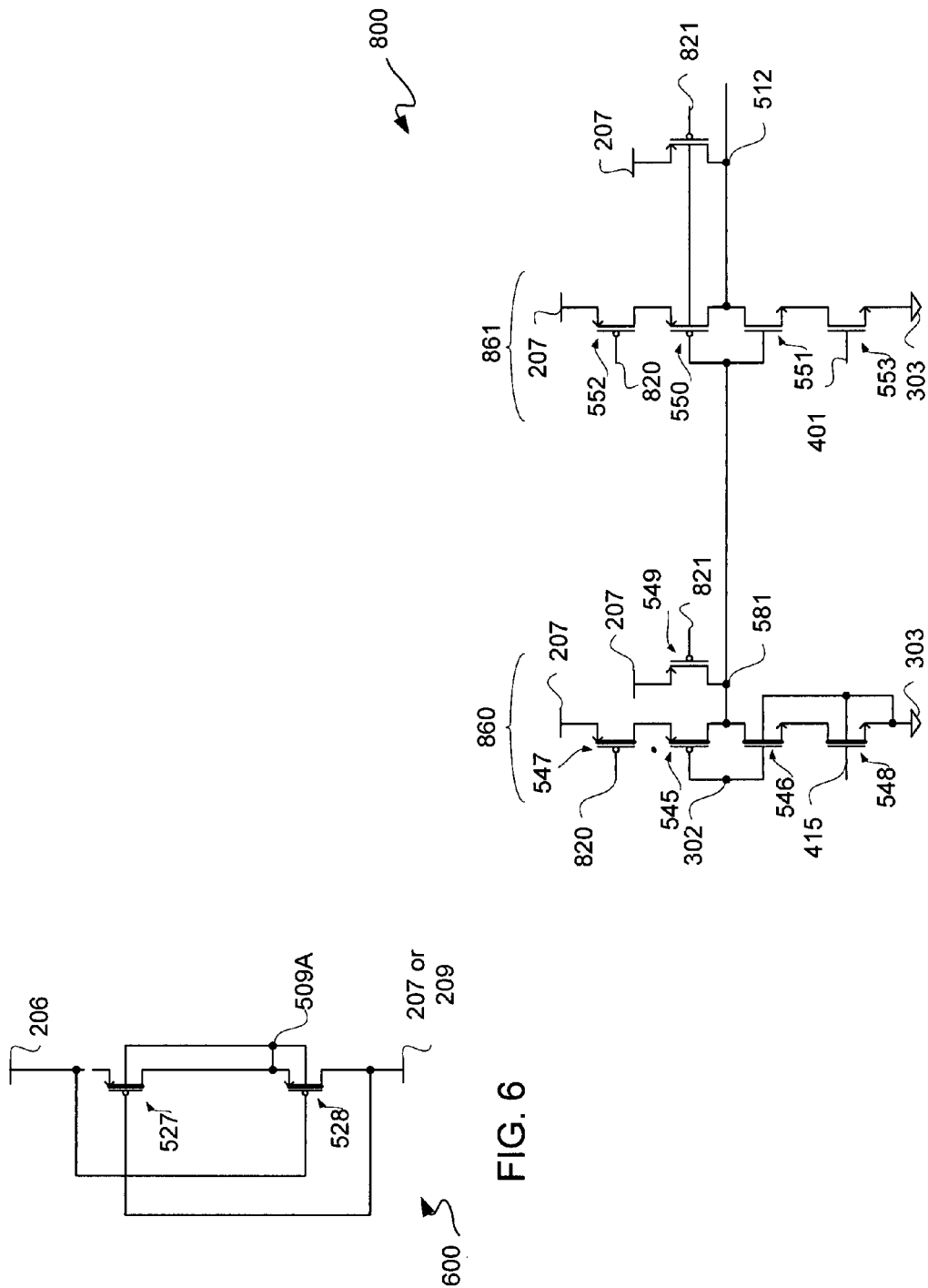

POWER-ON RESET CIRCUIT FOR A VOLTAGE REGULATOR HAVING MULTIPLE POWER SUPPLY VOLTAGES

FIELD OF THE INVENTION

The invention relates to integrated circuit devices (ICs). More particularly, the invention relates to a power-on reset circuit for a voltage regulator having multiple power supply voltages for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs, as well as other integrated circuits (ICs), may consume a significant amount of power in a fully operational mode, namely an "awake mode." More recently, PLDs have been configured with a dedicated low power mode of operation, namely a "suspend mode." With respect to PLDs, as well as other integrated circuits having volatile memory, information may be lost if power to such volatile memory is shut-off. Heretofore, for PLDs, power to such volatile memory associated with configuration memory was shut-off when using a suspend mode to conserve power. Thus, state of configuration of such configuration memory was lost due to conserving power by operating in a suspend mode. In order to maintain state of such configuration, a separate non-volatile memory may be used to store for example configuration information for configuring a PLD; however, a separate non-volatile memory adds cost and involves writing back the configuration state to configuration memory.

Accordingly, it would be desirable and useful to provide means to have some reduction in power consumption as compared to operation in an awake mode without losing information stored in volatile memory when in a suspend mode.

SUMMARY OF THE INVENTION

One or more aspects generally relate to integrated circuit devices (ICs). More particularly, the one or more aspects relate to a power-on reset circuit for a voltage regulator having multiple power supply voltages for an IC.

An aspect relates generally to a voltage clamping circuit. The voltage clamping circuit has a level shifter circuit. The level shifter circuit has a first output node and a second output node. The clamp logic is coupled to the level shifter circuit. The clamp logic is coupled to receive a first control signal and in response provide a clamp-on signal and a clamp-off signal. The clamp logic is powered using a first voltage; the first voltage is capable of a first logic high level. The clamp logic is configured to provide the clamp-on signal and the clamp-off signal to be in opposite logic states. The clamp logic is configured to provide the clamp-on signal to a gate of a first N-channel transistor of the level shifter circuit and to provide the clamp-off signal to a gate of a second N-channel transistor of the level shifter circuit. The first N-channel transistor is coupled to the first output node for selectively electrically decoupling and coupling the first output node to a ground potential or a regulated voltage (VGG) responsive to the clamp-on signal. The second N-channel transistor is coupled to the second output node for selectively electrically coupling and decoupling the second output node to the ground potential or the regulated voltage responsive to the clamp-off signal. The level shifter circuit has a third N-channel transistor, a first P-channel transistor, a second P-channel transistor, and a third P-channel transistor. The first P-channel transistor, the second P-channel transistor, and the third P-channel transistor are sourced using a second voltage; the second voltage is capable of a second logic high level. The third P-channel transistor is coupled to receive a second control signal to a gate thereof. The second control signal provided using a third voltage capable of a third logic high level. A drain of the third P-channel transistor is coupled to the first output node. The third N-channel transistor is coupled to receive a third control signal to a gate thereof. The third control signal provided using the third voltage. A drain of the second N-channel transistor is coupled to the second output node. The first P-channel transistor is coupled to the second output node at a gate thereof. A drain of the first P-channel transistor is coupled to the first output node. The second P-channel transistor is coupled to the first output node at a gate thereof. A drain of the second P-channel transistor is coupled to the second output node. The second voltage is derived from the first voltage, the third voltage, or the ground potential during a power-on reset condition.

Another aspect relates generally to a voltage circuit regulator. The voltage circuit regulator has a driver circuit including a first inverter, a second inverter, a first output transistor, and a second output transistor. The first inverter and the second inverter are tri-stated during a power-on reset mode. The first inverter and the second inverter each function as buffers during a suspend mode and an awake mode. The first output transistor is coupled to a first output node of the driver circuit, the first output node is of the first inverter. The second output transistor is coupled to a second output node of the driver circuit, the second output node is of the second inverter. The first inverter and the second inverter are powered in association with a first voltage. The first output transistor and the second output transistor are powered in association with a second voltage. The first voltage is provided using either a first supply or a second supply. The second voltage is provided using the second supply. The first output transistor and the second output transistor are each configured for being substantially conductive during the power-on reset mode.

Yet another aspect relates generally to a method of voltage regulation for a power-on reset condition. The method of voltage regulation includes obtaining control signals responsive to the power-on reset condition and generating a first power-on-reset signal and a second power-on-reset signal opposite in state to that of the first power-on-reset signal responsive to the control signals obtained. A portion of driver logic is tri-stated responsive to the control signals, and the second power-on-reset signal to at least impede supply to supply current leakage. Voltage on a first output port and a second output port of the driver logic are pulled up responsive to the first power-on-reset signal. A portion of a semiconductor substrate is coupled to a higher one of a first voltage and a second voltage responsive to the pulling up to at least further impede the supply to supply current leakage.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 6 is a circuit diagram depicting an alternative exemplary embodiment of an N-well and transistor circuit having an N-well, which may replace an N-well and associated circuitry of FIG. 5A.

FIG. 8 is a circuit diagram depicting an alternative exemplary embodiment of inverters of a POR buffer, which may respectively replace inverters of FIG. 5B.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
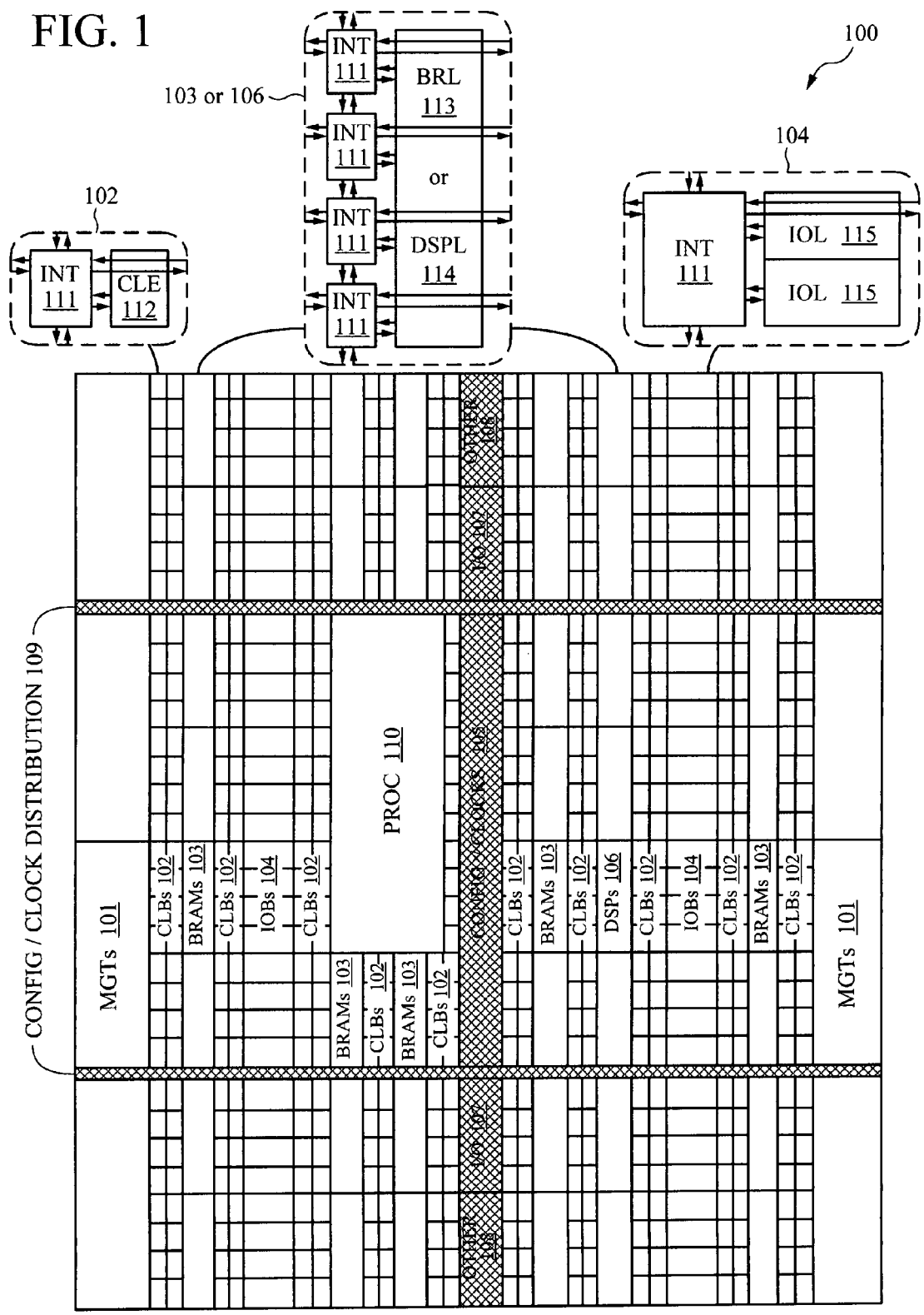
FIG. 1 is an exemplary embodiment of a field programmable gate array (FPGA) architecture that includes a large number of different programmable tiles.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block PROC 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Although FIG. 1 represents a Virtex-4T™ from Xilinx, Inc. of San Jose, Calif., other FPGAs, such as for example Spartan™-3A generation FPGAs from Xilinx, Inc. of San Jose, Calif., have a "suspend" mode that allows users to provide a "suspend" signal to an external pin to "shut-off" power consumption associated with use of a supply voltage, namely VCCAUX, to reduce static power.

FPGAs generally have several types of supply voltage input pins. For example, some FPGAs have VCCO, VCCAUX, and VCCINT as separate types of supply voltages that are provided from one or more external sources via external pins. VCCO is an externally provided supply voltage generally used to power output drivers. VCCAUX is an externally provided supply voltage generally used to power configuration memory, analog blocks, DCMs, and some I/O resources. VCCINT is an externally provided supply voltage, which is generally used to power programmable logic, including CLBs, of an FPGA, namely the "core logic" of an FPGA.

VCCINT is conventionally supplied in a range of approximately 1.0 to 1.2 volts, and VCCAUX is conventionally supplied in a range of approximately 2.5 to 3.3 volts. Both of such voltages may vary outside of these ranges within some threshold amount. Furthermore, values other than these voltages for VCCINT and VCCAUX may be used provided, however, that VCCINT is lower than VCCAUX, namely an upper most value of VCCINT is less than a lower most value of VCCAUX.

Heretofore, configuration memory was not powered using VCCINT in a suspend mode. Thus, use of the suspend mode for "shutting-off" power consumption associated with use of VCCAUX previously meant losing information stored in configuration memory, as such configuration memory was powered by VCCAUX. It should further be understood that configuration memory cells are volatile memory cells, such as Static Random Access Memory (SRAM) cells and Dynamic Random Access Memory (DRAM) cells. Of note, voltage levels for various memory technologies may be different; however, the embodiments described below may be used with any of a variety of voltages provided, however, that VCCINT is lower than VCCAUX.

In the embodiments described below, VCCINT is provided as a supply voltage to configuration memory cells when in a suspend mode. More particularly, the lower voltage of VCCINT may be used to maintain state of information stored in such configuration memory cells during a suspend mode. In a non-suspend mode, namely an awake mode, VCCAUX is used to supply voltage to configuration memory cells. As leakage is exponentially dependent on voltage at node VGG 209, there may be significant savings in current drawn by reducing voltage of VGG 209 voltage by a relatively small amount. For example, reducing voltage on the order of approximately 300 mV to 400 mV for the above identified voltage ranges may result in significant reduction in current draw. Moreover, the greater the difference between VCCINT 207 and VGG 209 in an awake mode may contribute to a more significant reduction in current draw.

By using VCCINT instead of VCCAUX to power configuration memory during a suspend mode, significant static power reduction may be achieved without losing configuration information stored in configuration memory. For an implementation in Spartan™-3A generation FPGAs, static power consumption for a suspend mode may be reduced by electrically decoupling VCCAUX to effectively shut-off power consumption associated with analog and I/O resources, while maintaining information stored in configuration memory using VCCINT. Thus, VCCAUX no longer has to be electrically coupled to configuration memory cells to maintain configuration information while in a suspend mode. Furthermore, VCCINT may be used to power only configuration memory in a suspend mode and need not be used for any other purpose.

In the following description, circuitry to implement use of VCCINT instead of VCCAUX for powering configuration memory is described. As described below in additional detail, this circuitry is added to one or more voltage regulators of an FPGA to facilitate use of VCCINT instead of VCCAUX for powering configuration memory during a suspend mode without adding significant complexity. In addition to being an elegant solution, it shall be appreciated that a voltage regulator described below in additional detail is capable of transitioning from awake mode to suspend mode and from suspend mode to awake mode with little to no current draw between VCCAUX and VCCINT supplies and with little to no regulated voltage (VGG) droop. Control signals for turning ON and OFF of transistors used to generate output voltage as described herein are based on self-timed principles. Transistors are turned ON and OFF in a controlled manner to prevent any race conditions that may cause current and voltage droop.

Because write voltage supplied for configuration memory is higher than the voltage level of VCCINT, VCCAUX is used during an awake mode for powering configuration memory. Basically, the lower read voltage (e.g., 1.2 volts) is used so as not to disturb state of configuration memory by use of a higher write voltage (e.g., 1.5 volts). Thus, VCCINT is not used during an awake mode for operation of configuration memory, as it is generally too low in voltage level for reliable write operation to configuration memory. Thus, in order to use VCCINT in a suspend mode, capability for toggling between VCCAUX and VCCINT for operation in a suspend mode and an awake mode, respectively, is provided.

Figure 2:
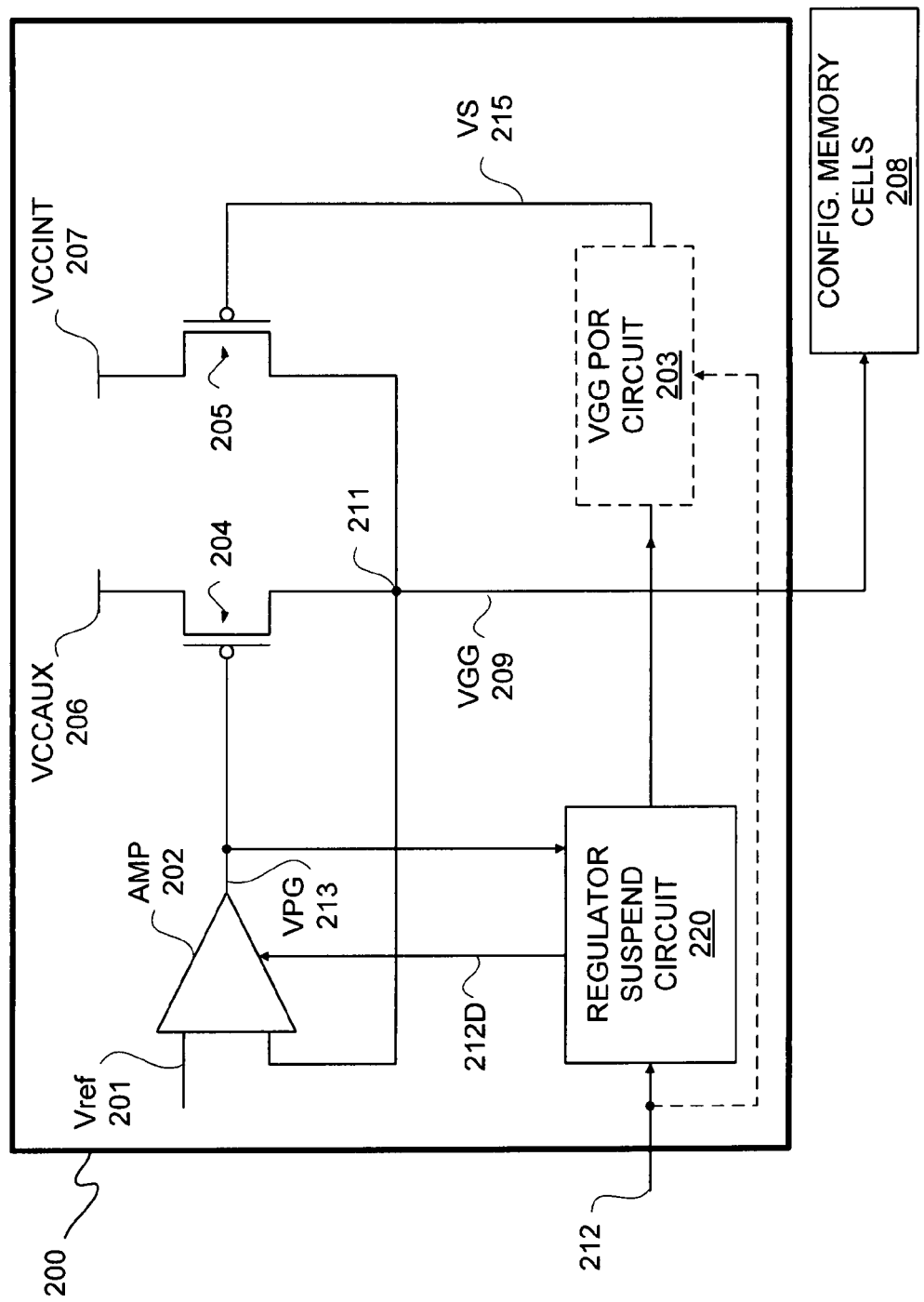
FIG. 2 is a block/circuit diagram depicting an exemplary embodiment of a voltage regulator, which may be coupled to configuration memory cells.

FIG. 2 is a block/circuit diagram depicting an exemplary embodiment of a voltage regulator 200, which may be coupled to configuration memory cells 208. Configuration memory cells 208 may be configuration memory cells associated with CLBs, such as CLBs 102 of FPGA of FIG. 1.

Voltage regulator 200 is operable in both an awake mode and a suspend mode, which modes are mutually exclusive with respect to one another as described herein. In an awake mode, VCCAUX 206 is generally used to supply voltage for powering configuration memory cells 208. In a suspend mode, VCCINT 207 is generally used for supplying voltage for powering configuration memory cells 208.

A reference voltage (Vref) 201, which may be a band gap reference voltage as is well known, is provided as an input to operational amplifier (AMP) 202. Another input to AMP 202 is sourced from output node 211 of voltage regulator 200. From output node 211, VGG 209 is provided, such as to configuration memory cells 208, and is provided as a feedback input to AMP 202. Output of AMP 202 is provided to a gate of P-channel transistor 204 and as an input to regulator suspend circuit 220. AMP 202, regulator suspend circuit 220, and P-channel transistors 204 and 205 may all be part of voltage regulator 200. Optionally, a VGG power-on reset circuit 203 may be part of voltage regulator 200.

P-channel transistor 204 has its source coupled to VCCAUX 206 and its drain coupled to output node 211. P-channel transistor 205 has its source coupled to VCCINT 207 and its drain coupled to output node 211. A gate of P-channel transistor 205 is coupled to receive a sense voltage (VS) 215 output from regulator suspend circuit 220. Another output from regulator suspend circuit 220 is an optionally delayed version of power-down signal 212, namely power-down signal 312 of FIG. 3A. Power-down signal 212 is provided as an input to regulator suspend circuit 220. Power-down signal 212 is negative logic, and thus may be thought of as a power-down bar or complement signal. Alternatively, an inverter may be used to implement a true or non-complemented version of power-down signal 212. Accordingly, it should be understood that signals as being true or complemented are only for purposes of clarity by way of example and not limitation. Power-down signal 212 may be a globally provided power-down signal as associated with an FPGA, such as FPGA 100 of FIG. 1.

It should be appreciated that use of VCCAUX 206 and VCCINT 207 for providing voltage to supply configuration memory cells 208 in an awake mode and suspend mode, respectively, is generally mutually exclusive, as described below in additional detail. Thus, if VCCAUX 206 is used to provide voltage for supplying configuration memory cells 208, VCCINT 207 is generally not used. And, if VCCINT 207 is used for supplying voltage to configuration memory cells 208, VCCAUX 206 is generally not used. There is some crossover of these uses of supply voltages 207 and 206, as described herein. More particularly, when switching from an awake mode to a suspend mode, it is desirable that a negligible amount, if any, of current flows between voltage supplies, namely between VCCINT 207 and VCCAUX 206. Additionally, it should be appreciated that when switching from a suspend mode to an awake mode, having little to no drooping of VGG 209 is desirable. This is because if VGG 209 droops to too low value, volatile memory cells may lose their data. However, this drooping to too low a value is avoided as described herein.

Additionally, for a POR, it may take some time for voltage supplies, such as VCCAUX 206 and VCCINT 207, to reach their respective target voltage levels or ranges. Accordingly, optionally a VGG POR circuit 203 may be coupled to receive power-down signal 212 to gate output of regulator suspend circuit 220 for providing VS 215 to a gate of P-channel transistor 205. Such gating would allow VS 215 to pass only after power-down signal 212 indicates that acceptable levels of VCCAUX 206 and VCCINT 207 have been reached. Power-down signal 212, which for an FPGA such as FPGA 100 of FIG. 1 is conventionally generated from configuration logic, is a known available control signal, and thus its generation is not described in unnecessary detail herein. For purposes of clarity and not limitation, VGG POR circuit 203 is not described in unnecessary detail, and may be considered included as part of control circuitry 301 of FIG. 3A.

Assuming that the initial state for an FPGA, or other integrated circuit, in which voltage regulator 200 is implemented is an awake mode, transition from awake mode to suspend mode shall be described first, followed by a description of a transition from a suspend mode to an awake mode with respect to operation of voltage regulator 200.

Figure 3A:
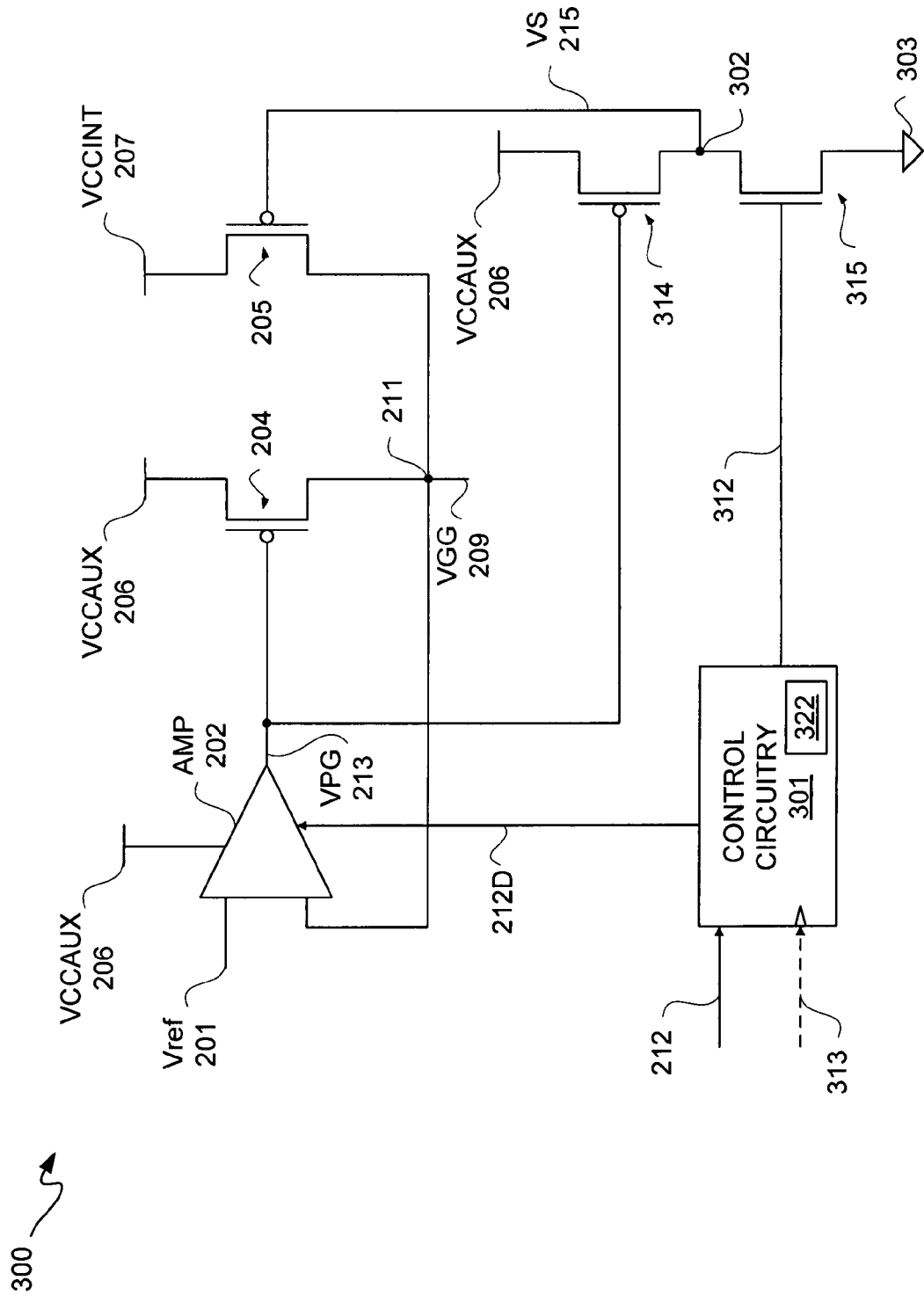
FIG. 3A is a block/circuit diagram depicting an exemplary embodiment of the voltage regulator of FIG. 2.

FIG. 3A is a block/circuit diagram depicting an exemplary embodiment of a voltage regulator 300. Voltage regulator 300 may be voltage regulator 200 of FIG. 2. Accordingly, transitioning from suspend mode to awake mode, and then from awake mode to suspend mode shall be described with respect to voltage regulators 200 and 300 with simultaneous reference to FIGS. 2 and 3.

Power-down signal 212 is provided as input to control circuitry 301, which may include both control circuitry for regulator suspend circuit 220, as well as optional VGG POR circuit 203. Regulator suspend circuit 220 includes transistors 314 and 315, as well as control circuitry 301. Although single instances of transistors are illustratively shown for purposes of clarity, multiple instances of such transistors may be used. Alternatively, transistor 314 may be replaced with a fixed resistor, where droop due to entering to a suspend mode is reduced or avoided by selecting a resistance value of the fixed resistor. Furthermore, alternatively, transistor 315 may be replaced with a fixed resistor, where current draw due to entering a suspend mode is reduced or avoided by delaying of power-down signal 312. In either of these alternatives, one of transistors 314 and 315 is present.

Figure 3B:
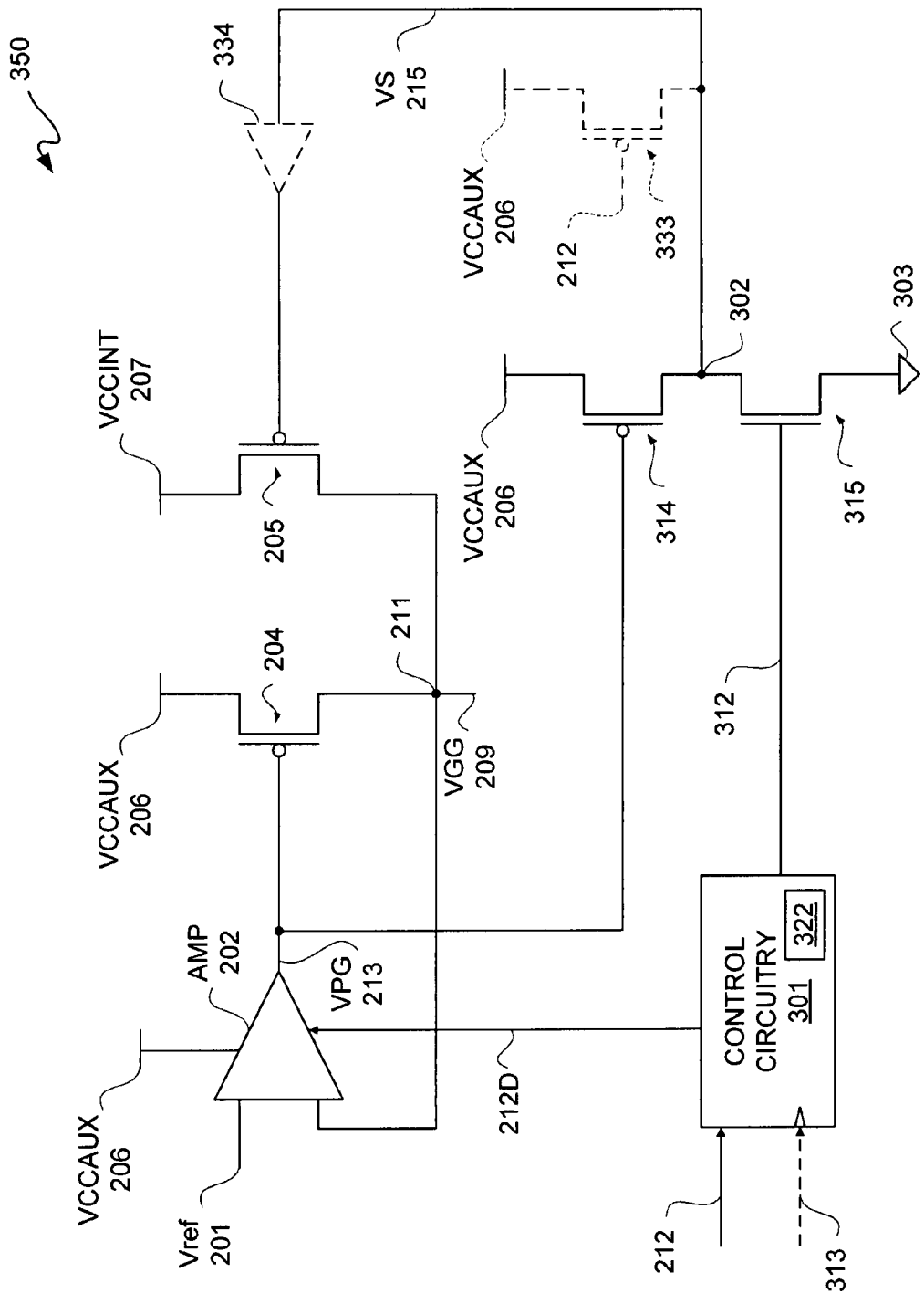
FIG. 3B is a block/circuit diagram depicting an alternative exemplary embodiment of the voltage regulator of FIG. 2.

Multiple voltage regulators may be driving VGG 209 node 211 in an FPGA. So some regulators may be off, namely VPG 213 of the OFF regulators are at a logic high voltage value, and remaining regulators may be on for supplying current. In instances where a regulator is off, off state leakage of transistors 314 and 315 determines VS 215 because transistors 314 and 315 are OFF in an awake mode of operation. If, however, transistor 315 leaks more than transistor 314, then VS 215 may be weakly electrical coupled to ground 303 and transistor 205 may thus turned ON electrically coupling VCCINT 207 to node 211 while VCCAUX 206 is electrically coupled to node 211 of the ON regulators causing a current path between VCCAUX 206 and VCCINT 207. To avoid this possibility, optional P-channel transistor 333 may be added as illustratively shown in FIG. 3B. FIG. 3B is a block/circuit diagram depicting an alternative exemplary embodiment of a voltage regulator 350. Voltage regulator 350 is voltage regulator 300 of FIG. 3A, except P-channel transistor 333 has been added. P-channel transistor 333 is in source-drain parallel with P-channel transistor 314. P-channel transistor is gate with power-down signal 212. P-channel transistor 333 is ON during an awake mode, and thus pulls up VS 215 independently of VPG 213 in an awake mode. In a suspend mode, P-channel transistor 333 is OFF. Thus, P-channel transistor 333 prevents electrically coupling VCCINT 207 to node 211 while VCCAUX 206 is electrically coupled to node 211 due to N-channel transistor 315 being more leaky than P-channel transistor 314 as previously described. Furthermore, an optional level-shifter buffer 334 may be coupled to receive VS 215, and the output of level-shifter buffer 334 may gate P-channel transistor 205.

In FIGS. 3A and 3B, P-channel transistors 204 and 205 are illustratively shown. However, alternatively, P-channel transistors 204 and 205 may be replaced with respective N-channel transistors. However, as use of N-channel transistors will be understood from the following description, description of an N-channel transistors embodiment is not described for purposes of clarity and not limitation. Furthermore, alternatively a mix of PMOS and NMOS transistors may be used. However, for purposes of clarity by way of example and not limitation, the embodiment of FIG. 3A is further described herein.

To enter into a suspend mode from an awake mode, power-down signal 212, which as described above is negative logic, shall be a logic low or logic 0. For transitioning from a suspend mode to an awake mode, there need not be any delay, or optionally delay may be used, in providing power-down signal 312 and power-down signal 212D to AMP 202 other than to compensate for delay due to inversion of power-down signal 212 to provide power-down signal 312, such that signals 212D and 312 are provided at least approximately at the same time to a control port of AMP 202 and a gate of N-channel transistor 315. However, this delay of power-down signal 312 may optionally be omitted, and alternatively power-down signal 212 may be used to directly control operation of AMP 202.

However, power-down signal 312 output from control circuitry 301 is optionally delayed by control circuitry 301 prior to being provided to a gate of N-channel transistor 315 for transitioning from a suspend mode to an awake mode. Although power-down signal 312 is optionally delayed for transitioning from a suspend mode to an awake mode by control circuitry 301, power-down signal 312 need not be delayed by control circuitry 301 for transitioning from an awake mode to a suspend mode. This is because sizing of transistors 314 and 315 provides for a self-timed generation of delay for transitioning from an awake mode to a suspend mode, as described below in additional detail. Delay of power-down signal 312 is optional and may be programmable. Moreover, delay of power-down signal 312 may be part of a default configuration.

A logic 0 provided from power-down signal 212D as a control signal input to AMP 202 disables the bias circuit associated with AMP 202 and causes output of AMP 202 to be a logic 1. Output of AMP 202 is provided as an input to the gate of P-channel transistor 204 and as an input to the gate of P-channel transistor 314. Output of AMP 202 therefore is referenced as P-gate voltage (VPG) 213. A logic high output from AMP 202 pulls the gates of P-channel transistors 204 and 314 to a logic high state.

Accordingly, it may be understood that responsive to VPG 213 being a logic high, P-channel transistors 204 and 314 are at least substantially non-conductive across their channels, namely source-to-drain. In a suspend mode, VCCAUX 206 is effectively electrically decoupled from output node 211 responsive to output of AMP 202 being at logic high. Furthermore, P-channel transistor 314 has its source coupled to VCCAUX 206 and its drain coupled to sense node 302, which means that VCCAUX 206 is effectively electrically decoupled from sense node 302 responsive to VPG 213 being a logic high.

P-channel transistor 314 is drain-to-drain coupled to N-channel transistor 315 at sense node 302. A source of N-channel transistor 315 is coupled to a ground 303, which may be an actual ground or a virtual ground. From sense node 302, VS 215 may be sourced for gating P-channel transistor 205.

In the awake mode, P-channel transistor 205 is at least substantially non-conductive as being shut-off by application of VCCAUX 206 to a gate of P-channel transistor 205 via P-channel transistor 314. Power-down signal 312 is at a logic low state for turning OFF N-channel transistor 315 for electrically decoupling from ground 303. However, for a transition to a suspend mode, P-channel transistor 314 is switched to be substantially non-conductive, N-channel transistor 315 is turned ON by power-down signal 312 and thus VCCAUX 206 is electrically decoupled from the gate of P-channel transistor 205.

Power-down signal 312, which is a logic high in suspend mode and is provided to a gate of N-channel transistor 315, causes N-channel transistor 315 to be at least substantially conductive. Accordingly, sense node 302 is electrically decoupled from VCCAUX 206 and electrically coupled to ground 303, and thus a gate of P-channel-transistor 205 is electrically coupled to ground 303. Coupling a gate of P-channel transistor 205 to ground 303 means that VCCINT 207 is electrically coupled by an at least substantially conductive P-channel transistor 205 to output node 211 for supplying VGG 209.

For purposes of clarity by way of example and not limitation, it shall be assumed that VCCAUX 206 is 2.5 volts, VCCINT 207 is 1.2 volts, and a target value for VGG 209 is 1.5 volts. The target value of 1.5 volts for VGG 209 is for an awake mode, as it is well understood that the higher voltage level is used for being able to write to configuration memory cells 208. Conventionally, Vref 201 may be set equal to or approximately equal to the target value for VGG 209. Thus, Vref 201 may be set approximately equal to 1.5 volts in this example. AMP 202 need not put out ground voltage level for a logic 0 for purposes of operating in an awake mode; rather, the difference between VCCAUX 206 and VPG 213 for operating P-channel transistor 204 in a substantially conductive mode need only differ by slightly more than one threshold voltage (VTP) of P-channel transistor 204. Thus, for the above numerical example, assuming threshold voltage of P-channel transistor 204 is approximately 500 mV to 700 mV, VPG 213 for an awake mode may be in a range of approximately 1.6 to 1.9 volts depending on how much amperage needs to pass through for the loading at output node 211.

Of course, output of AMP 202 may be driven to 0 volts for providing to the gate of P-channel transistor 204 if the amount of current to be provided for driving the load coupled to output node 211 is excessive. It should therefore be appreciated that both P-channel transistors 204 and 314 in an awake mode will be at least substantially conductive, if not fully conductive.

Assuming AMP 202 is powered by VCCAUX 206 as illustratively shown in FIG. 3A, responsive to the bias circuit associated with AMP 202 being disabled as described above, output of AMP 202 will be approximately the voltage level of VCCAUX 206, which will pull the gates of P-channel transistor 314 and P-channel transistor 204 up to the approximate voltage level of VCCAUX 206.

For power-down signal 312 being a logic high in transition to a suspend mode, N-channel transistor 315 transitions from a substantially non-conductive state to an at least substantially conductive state for purposes of electrically coupling ground 303 to the gate of P-channel transistor 205. P-channel transistor 205 therefore electrically couples VCCINT 207 to output node 211 for providing VGG 209 to configuration memory cells 208. VCCINT 207 may be unaltered from the voltage provided off-chip and thus may be subject to off-chip regulation. For example, if 1.2 volts is provided off-chip to a VCCINT input pin of an FPGA, then VCCINT 207 would be approximately 1.2 volts. VCCINT may alternatively be internally regulated in an IC.

It should be appreciated that load at node VPG 213 from P-channel transistor 204 may be significant. So when transitioning from an awake mode to a suspend mode, N-channel transistor 315 is put into a substantially conductive mode and P-channel transistor 314 is put into a substantially non-conductive mode; however, these transitions do not take place immediately. P-channel transistor 314 is sized so as to be larger than N-channel transistor 315, though not illustratively shown in FIG. 3A. Therefore, P-channel transistor 314 may be generally characterized as a strong P-channel transistor and N-channel transistor 315 may be generally characterized as a weak N-channel transistor. Accordingly, when transitioning from a suspend mode to an awake mode, N-channel transistor 315 contends at sense node 302 with P-channel transistor 314, which is driven by VPG 213.

When VPG 213 rises to approximately being within one VTP of P-channel transistor 314 of VCCAUX 206, only then will N-channel transistor 315 overcome this contention and pull sense node 302 to a ground potential for turning regulator P-channel transistor 205. Because of this self-timing or built in timing in delaying the transitioning from use of P-channel transistor 314 to use of N-channel transistor 315 for providing VS 215, there is a negligible amount of droop of VGG 209 and of leakage current between VCCAUX 206 and VCCINT 207 when switching from an awake mode to a suspend mode. As described below in additional detail, there is little opportunity for current to flow between VCCINT 207 and VCCAUX 206 or for VGG 209 to droop.

It should be appreciated that the relative strength or sizing of P-channel transistor 314 to N-channel transistor 315 is such that even if N-channel transistor 315 is completely conductive, P-channel transistor 314 still overcomes the electrical coupling of sense node 302 to ground 303 by providing VCCAUX 206 to sense node 302 up until or at least approximately until there is less than approximately one VTP of P-channel transistor 314 difference between VCCAUX 206 and VPG 213.

This means that when the transition does occur, namely when P-channel transistor 314 is substantially non-conductive and N-channel transistor 315 is substantially conductive and voltage at sense node 302 is at least approximately at ground potential of ground 303, P-channel transistor 205 is fully or at least approximately fully conductive. Because P-channel transistor 205 when activated for regulating VGG 209 is activated to be so conductive, there is less opportunity for drooping of VGG 209. P-channel transistor 204 is OFF at this time, as VPG 213 is at a VCCAUX 206 level and hence there is less opportunity for current to flow between VCCINT 207 and VCCAUX 206.

When transitioning voltage regulator 200 or 300 from a suspend mode to an awake mode, power-down signal 212 is a logic high level. This logic high level is passed along in the form of power-down signal 212D to a control input of AMP 202 to activate a bias circuit associated with AMP 202. Loading from P-channel transistor 204 may be significant and may cause voltage at node VPG 213 to change slowly. Furthermore, the output of AMP 202 drives a significantly large load, which will slowly adjust after VPG 213 goes below a level which is below one VTP of P-channel transistor 204 from a voltage level of VCCAUX 206. However, once below one VTP of P-channel transistor 204 from VCCAUX 206, P-channel transistor 204 and P-channel transistor 314 will transition from being substantially non-conductive to being substantially conductive. It is assumed for purposes of clarity and not limitation that transistors 204 and 314 have at least approximately equal VTPs.

VS 215 sourced from sense node 302 will rise and eventually shut off P-channel transistor 205 from regulating VGG 209. However, the relative speed at which VPG 213 goes from VCCAUX 206 for example to one VTP therebelow is slow as compared to the rate at which power-down signal 312 can transition from a logic high level to a logic low level due to the load at output node 211, as well as the relative size of P-channel transistors 204 and 314.

It should be appreciated that the loading on the output of AMP 202 is significant in part because of the loading of configuration memory cells 208 at output node 211 and in part because of the size of P-channel transistor 204. Accordingly, P-channel transistor 314 and N-channel transistor 315 have significantly less loading. Because of the large loading, VPG 213 changes more slowly than power-down signal 212. To avoid or reduce droop of VGG 209 responsive to this difference in reaction time, power-down signal 312 may be delayed to prevent or reduce such drooping when transitioning from a suspend mode to an awake mode. Again, delay of power-down signal 312 is optional, and may be part of a default configuration.

This delay may be a fixed delay or programmed into control circuitry 301. Such delay may optionally be indexed to a clock input 313, such as for use of a counter for example. A counter implemented in control circuitry 301 need only be triggered on one edge, for example a rising-edge-only-triggered counter 322. Furthermore, the delay between receiving a logic high power-down signal 212 and providing a logic low power-down signal 312 from such counter 322 may be in a range of approximately 0 to 3 microseconds. Thus, the amount of delay may be tailored for having a sufficient but not undue amount of delay during transition from a suspend mode to an awake mode with limited droop of VGG 209. Furthermore, by delaying application of a logic low level voltage from power-down signal 312 to make N-channel transistor 315 substantially non-conductive, there is a better timing balance with respect to electrically decoupling VCCINT 207 from output node 211 and tying VCCAUX 206 to output node 211, namely there is a negligible current flowing between VCCAUX 206 and VCCINT 207.

During this period of delay of application of a logic low for power-down signal 312 for transitioning from a suspend mode to an awake mode, AMP 202 is on and thus VCCINT 207 is electrically coupled to output node 211. This means that effectively the suspend mode is extended as VCCINT 207 is used to help provide VGG 209, as VPG 213 drops slowly across P-channel transistor 204 to regulate VGG 209. In other words, VCCINT 207 is used as a helper voltage for VCCAUX 206 during this extended suspend mode or early awake mode to reduce or minimize VGG 209 droop with a negligible amount of current flowing between VCCAUX 206 and VCCINT 207.

VPG 213 need not fall completely below one VTP from VCCAUX 206 before voltage at sense node 302 will rise; however, sizing of P-channel transistor 314 relative to N-channel transistor 315 may be targeted such that voltage at sense node 302 will rise at least approximately when VPG 213 is one VTP below VCCAUX 206. Example ratios of transistor width and length as between P-channel transistor 314 and N-channel transistor 315 may be on the order of 20:1 at one end and approximately 50:1 at another end of a range. These ratios are for purposes of clarity by way of example and not limitation. Moreover, such ratios as between same products may be different depending for example on semiconductor process variations. By having a strong P-channel transistor 314 in comparison to a weak N-channel transistor 315, complete dependence on a delay of control circuitry 301 in providing power down signal 312 may be avoided.

Because VCCINT 207 is at a lower voltage level than VCCAUX 206, and furthermore because VCCINT 207 does not supply power to as much circuitry as VCCAUX 206, use of VCCINT 207 to retain state of configuration memory cells 208 during a suspend mode has a significant advantage both with respect to reducing leakage current as well as reducing static power consumption. VCCAUX 206 as implemented in Spartan™-3A generation FPGAs operates in a range of approximately low tens to low hundreds of microamps in the suspend mode, in comparison to a range of approximately tens of milliamps in the awake mode. VCCINT 207 current operates in a range of approximately tens of milliamps in the suspend mode, in comparison to a range of approximately low tens of microamps in the awake mode. Accordingly, it should be appreciated that this reduction in power consumption facilitates low power applications including mobile applications. Furthermore, it should be appreciated that due to the elegant nature of the voltage circuitry described herein, such circuitry consumes small amounts of semiconductor area, power, and logic overhead while providing a reliable, regulated memory cell voltage when switching between awake and suspend modes.

Figure 4:
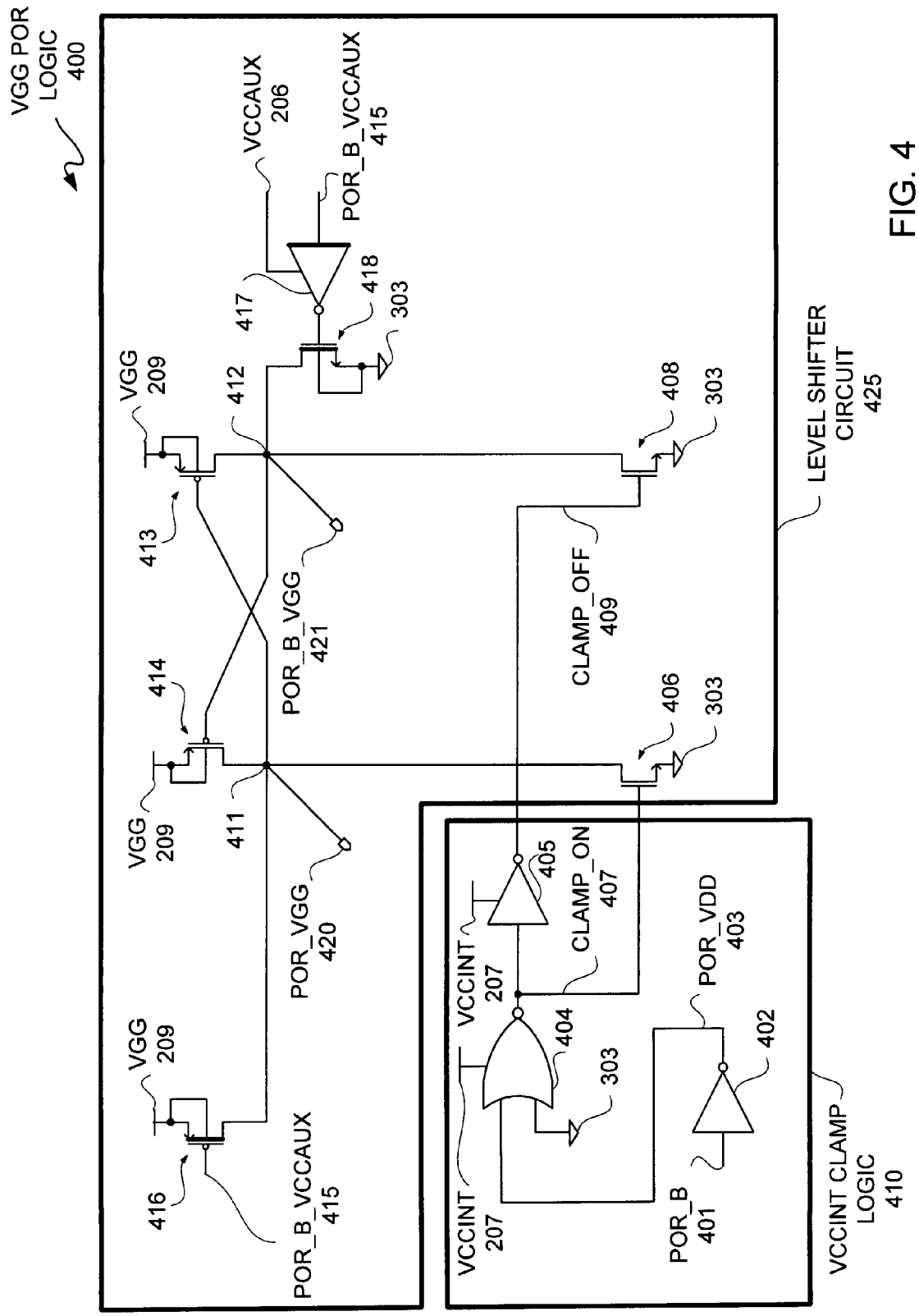
FIG. 4 is a circuit diagram depicting an exemplary embodiment of VGG POR logic.

FIG. 4 is a circuit diagram depicting an exemplary embodiment of VGG POR logic 400. VGG POR logic 400 may be used to implement VGG POR circuit 203 of FIG. 2. Thick lines for N-channel transistor 418, P-channel transistors 416 and 418, and inverter 417, indicate generally thicker oxides for increased power handling capacity of such transistors associated therewith. Use of thick oxide transistors is optional, and may vary from application to application depending for example on voltage supply levels and semiconductor process technology.

Control signals such as POR, POR_B, POR_B_VCCAUX, among others are generated by a host integrated circuit, such as FPGA 100 of FIG. 1. During a POR condition, a POR signal is logic high after a trip point is attained by a supply voltage, and POR_B_VCCAUX signal 415 is logic low. A POR signal follows a respective supply voltage ramp. In this example, the POR signal follows a ramping of VCCINT 207. POR_B_VCCAUX signal 415 is a VCCAUX 206 supply level signal. POR_B signal 401, which is a VCCINT 207, namely VDD, supply level signal, is a control signal generated during a POR condition that may be passed through inverter 402 to provide POR_VDD signal 403. POR_VDD signal 403 is a VCCINT supply level signal. Inverter 402, NOR gate 404, inverter 405, and N-channel transistors 406 and 408 are all part of VCCINT clamp logic 410 and are all powered using VCCINT 207, namely all are VCCINT supply level powered.

During a POR cycle or condition, POR_B signal 401 is logic low, and thus POR_VDD signal 403 is logic high for a POR condition. POR_VDD signal 403 follows VCCINT 207. POR_VDD signal 403 may be provided as an input to NOR gate 404. Another input to NOR gate 404 may be coupled to ground 303. In an alternate embodiment, NOR gate 404 may be replaced with an inverter for example. During a POR condition, output from NOR gate 404 may be logic low. NOR gate 404 output is provided as an input to inverter 405 and to a gate of N-channel transistor 406. Output from inverter 405 is provided to a gate of N-channel transistor 408. Output from NOR gate 404 to the gate of N-channel transistor 406 may be referred to as a clamp-on signal 407, and output from inverter 405 to the gate of N-channel transistor 408 may be referred to as clamp-off signal 409.

A POR signal follows VCCINT 207 or VCCAUX 206. Tables 1 and 2 below show examples of different supply and control signal logic levels during a POR condition. At states E and H respectively of Tables 1 and 2, the POR condition is done and the FPGA may be configured. Thus, for example, states F and G of Table 2 are during a POR condition. Table 2 in effect is a subset of Table 1.

TABLE 1

| State | VCCINT | VCCAUX | POR_B_VCCINT | POR_B_VCCAUX | POR_VCCINT | POR_VGG | POR_B_VGG |
|---|---|---|---|---|---|---|---|
| A | 0 | 0 | 0 | 0 | 0 | 0 | 0 |
| B | 0 | 1 | 0 | 0 | 0 | VGG | 0 |
| C | 1 | 0 | 0 | 0 | 1 | VGG | 0 |
| D | 1 | 1 | 0 | 0 | 1 | VGG | 0 |
| E | 1 | 1 | 1 | 1 | 0 | 0 | VGG (1) |

TABLE 2

| State | VCCINT | POR_B | CLAMP_ON | CLAMP_OFF |
|---|---|---|---|---|
| F | 0 | 0 | 0 | 0 |
| G | 1 | 0 | 0 | 1 |
| H | 1 | 1 | 1 | 0 |

POR_B_VGG and POR_VGG are generally either at a VGG supply level or 0 volts during a POR condition, as indicated in the last two columns of Table 1. At state E, a logic high VGG 209 supply level is reached, which may be though of as a logic 1. Additionally, VGG as indicated in Table 1 may be thought of as operative logic 1s during a POR condition. VGG 209 generally transitions from zero volts to the voltage level of VCCINT 207 during a POR condition. VGG 209 may change, for example approximately from 0.4 to 0.5 volts, under some conditions, such as for example when VCCAUX 206 ramps relatively fast or when P-channel transistor 204 turns OFF relatively slowly.

A source of N-channel transistor 406 is coupled to ground 303, and a drain of N-channel transistor 406 is coupled to output node 411 of level shifter circuit 425. N-channel transistor 408 has its source coupled to ground 303 and its drain coupled to output node 412 of level shifter circuit 425.

Continuing the example of a POR condition, it shall be assumed that VCCINT 207 has reached a sufficiently high voltage, namely greater than an N-channel threshold voltage ("VTN") to turn ON N-channel transistors 406 and 408, as well as N-channel transistors of logic 402, 404, and 405. N-channel transistor 406 may be substantially non-conductive responsive to clamp-on signal 407. Thus, output node 411 will not be electrically coupled to ground 303 drain to source via N-channel transistor 406 for a POR condition. However, during a POR condition, N-channel transistor 408 may be substantially conductive responsive to clamp-off signal 409. Thus, output node 412 will be electrically coupled to ground 303 drain to source via N-channel transistor 408 for a POR condition.

It should be understood that logic of VCCINT clamp logic 410 for providing clamp-on signal 407 and clamp-off signal 409 is powered using VCCINT 207. During a POR condition, VCCINT 207 may be initially 0 volts and rise to a target voltage level, for example 1.2 volts. It should be understood that voltage of clamp-off signal 409 during a POR condition will follow VCCINT 207. As VCCINT 207 rises toward a target voltage level, such as for example 1.2 volts, N-channel transistor 408 progressively becomes more conductive. Accordingly, during a POR condition there may be a short amount of time in which both clamp-on signal 407 and clamp-off signal 409 are effectively at logic low levels, during which time clamp-off signal 409 is in an invalid state.

Once VCCINT 207 has risen sufficiently in voltage during a POR condition, clamp-off signal 409 is a VCCINT logic high level. Thus, generally VCCINT clamp logic 410 has only one active low output at a time, namely coupling ground 303 to output node 412 during a POR condition or coupling ground 303 to output node 411 during operation after the completion of the POR condition.

VGG 209, which is powered using VCCAUX 206 as previously described with reference to FIGS. 2 and 3, is usually at ground at the start of a POR condition and relatively slowly rises to a target voltage level or logic level as VCCAUX 206 and VCCINT 207 rise. For purposes of clarity by way of example and not limitation, this target voltage level is assumed to be a logic high level of VCCINT 207. However, under some conditions VGG 209 may temporarily rise to a level that exceeds VCCINT 207 during a POR condition. For example, this event may temporarily happen when VCCINT 207 is at ground potential and during a POR condition a VCCAUX supply of the VGG 209 node is charged up to an intermediate value via P-channel transistor 204 before such transistor shuts OFF. As previously indicated, a control signal during a POR condition generated by a host may be POR_B_VCCAUX signal 415. During a POR condition, POR_B_VCCAUX signal 415 is logic low and is of a VCCAUX 206 voltage level. POR_B_VCCAUX 415 is coupled to a gate of P-channel transistor 416.

A source of P-channel transistor 416 is coupled to receive VGG 209. Additionally, a body region of P-channel transistor 416 may be coupled to its source for back body biasing using VGG 209. A drain of P-channel transistor 416 is coupled to output node 411. Thus, P-channel transistor 416 may be used to pull-up voltage on output node 411 toward VGG 209 during a POR condition. A signal POR_VGG 420 may be sourced from output node 411. POR_B_VCCAUX 415 and related circuitry may be used in setting voltage levels during a POR condition when the VCIINT level is too low or zero for clamp-on signal 407 and clamp-off signal 409 to have valid logic levels for determining level-shifter functionality as described below.

POR_B_VCCAUX signal 415 is provided as an input to inverter 417 which is powered using VCCAUX 206. For a POR condition output of inverter 417 is a logic high, which may rise to a VCCAUX 206 logic high level. Output of inverter 417 is provided to a gate of N-channel transistor 418. N-channel transistor 418 may have its source coupled to ground 303. Additionally, a body region of N-channel transistor 418 may be coupled to its source for back body biasing to ground 303. A drain region of N-channel transistor 418 is coupled to output node 412. In POR condition, output of inverter 417 is a logic high, which eventually places N-channel transistor 418 in a substantially conduction state as VCCAUX 206 rises, and thus further eventually electrically couples ground 303 to output node 412. A POR_B_VGG signal 421 may be sourced from output node 412. Again, POR_B_VCCAUX 415 and related circuitry may be used in setting voltage levels during a POR condition when the VCIINT level is too low or zero for clamp-on signal 407 and clamp-off signal 409 to have valid logic levels for determining level-shifter functionality as described above.

P-channel transistor 413 has its gate coupled to output node 411, and a drain of P-channel transistor 413 is coupled to output node 412. A source of P-channel transistor 413 is coupled to receive VGG 209. Furthermore, a body region of P-channel transistor 413 may be coupled to be back body biased using VGG 209. For a POR condition, output node 412 is not coupled to VGG 209 source to drain via P-channel transistor 413 as VGG 209 rises to a VGG 209 logic high level.

Output node 412 is coupled to a gate of P-channel transistor 414. A drain of P-channel transistor 414 is coupled to output node 411. A source of P-channel transistor 414 is coupled to receive VGG 209. Additionally, P-channel transistor 414 may be back body biased using VGG 209 by coupling the source to the body region thereof.

Continuing the example of a POR condition, output at output node 412 is coupled to ground. P-channel transistor 414 is put in a substantially conductive state during a POR condition, and thus output node 411 is coupled to VGG 209 source to drain via P-channel transistor 414.

P-channel transistors 413, 414, and 416, N-channel transistor 406, 408, and 418, and inverter 417 provide a level shifter circuit 425. Outputs sourced from level shifter circuit 425 are obtained from output nodes 411 and 412. VCCINT clamp logic 410 uses VCCINT levels for clamping either output node 411 or 412 to ground. Thus, for a POR condition, clamp-off signal 409 is a logic high and thus output node 412 is coupled to ground 303. In a POR condition, voltage at output node 411, namely POR_VGG signal 420, may be eventually at a VGG 209 level. Moreover, POR_B_VGG signal 421 may be at ground during a POR condition.

As described above, VGG 209 is powered through VCCAUX 206 ramp to a voltage higher than VCCINT 207. If VCCINT 207 is significantly higher than VGG 209, for example when VGG 209 equals zero volts and VCCINT 207 equals 1.2 volts, then both POR and POR_B_VGG are logic zero. To handle this condition, a POR buffer circuit may be used as described below in additional detail.

Level shifter circuit 425 uses a VCCAUX-level based input signal, namely POR_B_VCCAUX signal 415, and shifts such level to a VGG-level based output signal, namely either signal POR_VGG signal 420 or POR_B_VGG signal 421. After a POR cycle has completed, clamp-off signal 409 is a logic low and clamp-on signal 407 is a logic high. In this non-POR state, output node 411 is coupled to ground 303 and output node 412 is electrically decoupled from ground 303, as N-channel transistor 408 is a substantially nonconductive state. Having output node 411 coupled to ground 303 causes P-channel transistor 413 to be substantially conductive, which causes output node 412 to be coupled to VGG 209.

For a non-POR condition when voltage supplies have reached their target logic levels for circuits to function properly, POR_B_VCCAUX signal 415 is logic high, and thus output of inverter 417 is logic low. POR_B signal 401 is logic high as previously described. Thus, for a non-POR condition for VGG 209 less than VCCAUX 206, N-channel transistor 418 and P-channel transistor 416 are both in a substantially nonconductive state. In short, VGG POR logic 400 is in a steady state where POR_VGG signal 420 stays at ground potential and POR_B_VGG signal 421 stays at a VGG logic high level. Thus, the clamp of VGG POR logic 400 stays on until another POR condition. Even though a specific level-shifter topology has been described, any of a variety of known level shifter topologies may be used in accordance with the functional description herein. Moreover, if VGG 209 is comparable or less than VCCINT 207 in a normal mode of operation, level shifter circuit 425 may be two inverters in addition to P-channel transistor 416, inverter 417 and N-channel transistor 418 to operate correctly, as described below in additional detail with reference to FIG. 7. Level-shifters may be used when voltage levels are significantly different.

It should be understood that during a period of POR condition, VCCAUX and VCCINT may be anywhere between 0 volts and their final target value or within their final target range. Accordingly, VCCINT at some time may be greater than VCCAUX, and thus there may exist a current leakage path from VCCINT to VCCAUX during a POR condition. Likewise, VCCAUX may be greater than VCCINT, and thus there may be a current leakage path from VCCAUX to VCCINT during a POR condition. Depending on different supply ramps and at different times during a POR condition, VGG 209 can be at different voltage levels, namely for example 0 volts, the voltage level of VCCINT 207, or some intermediate level between 0 volts and the voltage level of VCCINT 207. Thus there may be a current leakage path from VCCAUX 206 to VCCINT 207 through the VGG 209 node during a POR condition. Impact of such above-described leakage paths, if any, may be reduced, as described below in additional detail. However, it should be understood that because VCCINT-based signals and a VCCAUX-based output, namely from inverter 417 and P-channel transistor 416, are used, it does not matter whether VCCINT leads or lags rising voltage level of VCCAUX, and vice versa, because both are used to drive signals 420 and 421 to their valid states for a POR condition.

Furthermore, level shifter circuit 425 may be used to generate POR_VGG signal 420 and POR_B_VGG signal 421 at VGG levels during a POR condition, or after a POR cycle has completed, to gate a PMOS path to prevent current leakage between VCCINT and VCCAUX. It should be understood that at some time during a POR condition VGG 209 relatively slowly rises and equals the magnitude level of VCCINT 207, and after completion of a POR condition, VGG-based signals have a higher logic high voltage level than VCCINT-based signals. Under some POR circumstances, VGG 209 is capable of being greater than VCCINT 207. Thus, use of VGG-based signals along with VCCINT-based signals are used to more reliably, as well as more completely, place P-channel transistors in a substantially non-conductive state than comparable VCCINT-based signals. Thus, it should be appreciated that VGG POR logic 400 is capable of handling a condition when VGG 209 equals 0 volts or significantly less than VCCINT 207, when VGG 209 is greater than VCCINT 207, and when VGG 209 has become greater than VCCAUX 206. In application, VGG 209 usually tends to be at zero volts and rises slowly to its correct level through rising of VCCAUX 206; however, in some instances VGG 209 might be temporarily greater than VCCINT 207 or even greater than VCCAUX 206 during a POR condition. Using the VGG level and VCCINT voltages in a POR buffer and POR well bias circuits helps preventing supply to supply, as well as supply to ground, leakage source to drain across P-channel transistors. Thus, the highest available voltage during the POR condition is always used, and this selection reduces or eliminates any and all of the above-described types of leakage. Additional circuitry that may be used to prevent or reduce cross-supply current leakage between VCCAUX and VCCINT, as well as supply to ground leakage, is described in additional detail with reference to FIGS. 5A and 5B.

Figure 5A:
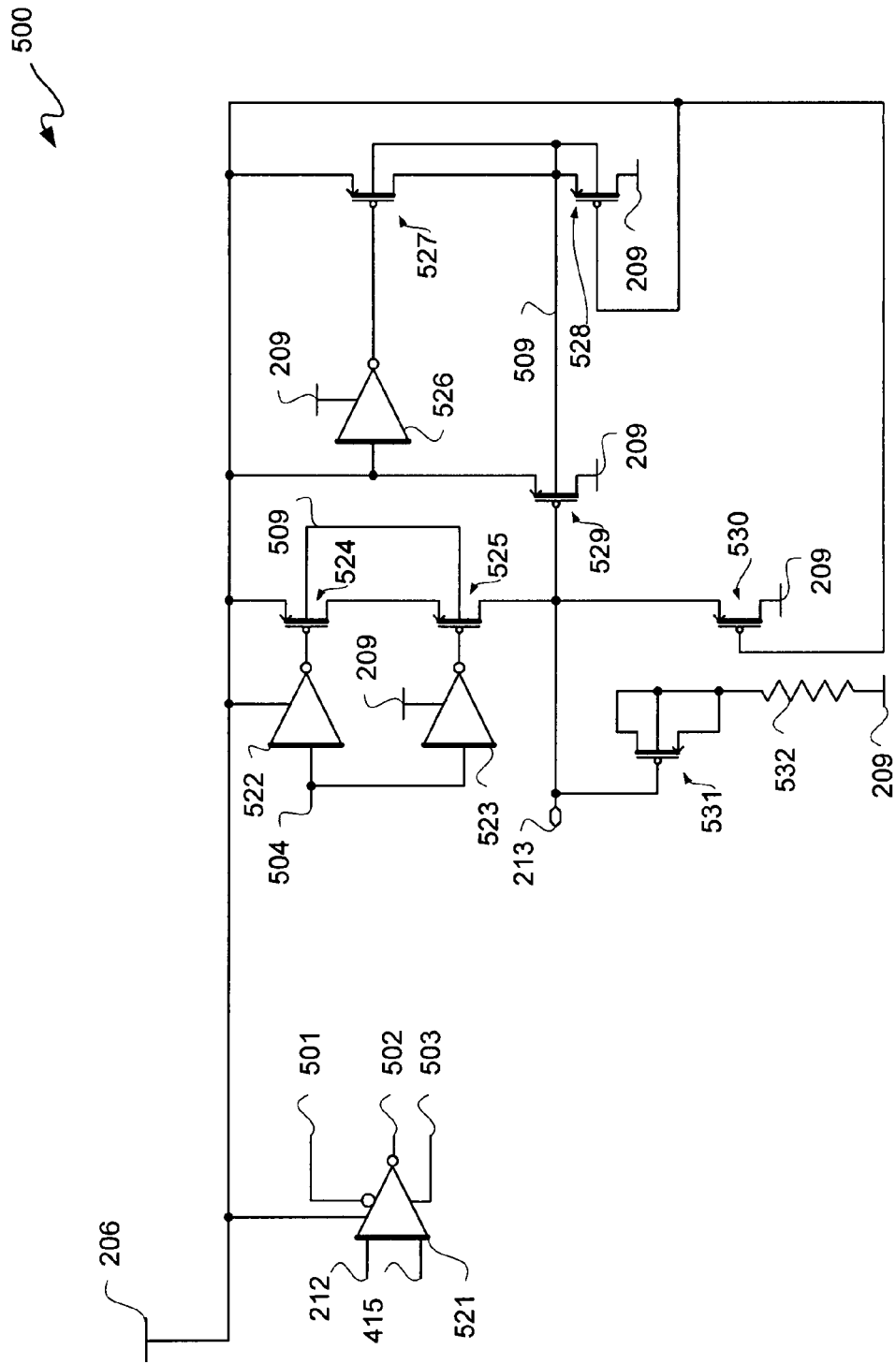
FIGS. 5A and 5B in combination are a circuit diagram depicting an exemplary embodiment of a VGG regulator.
Figure 5B:
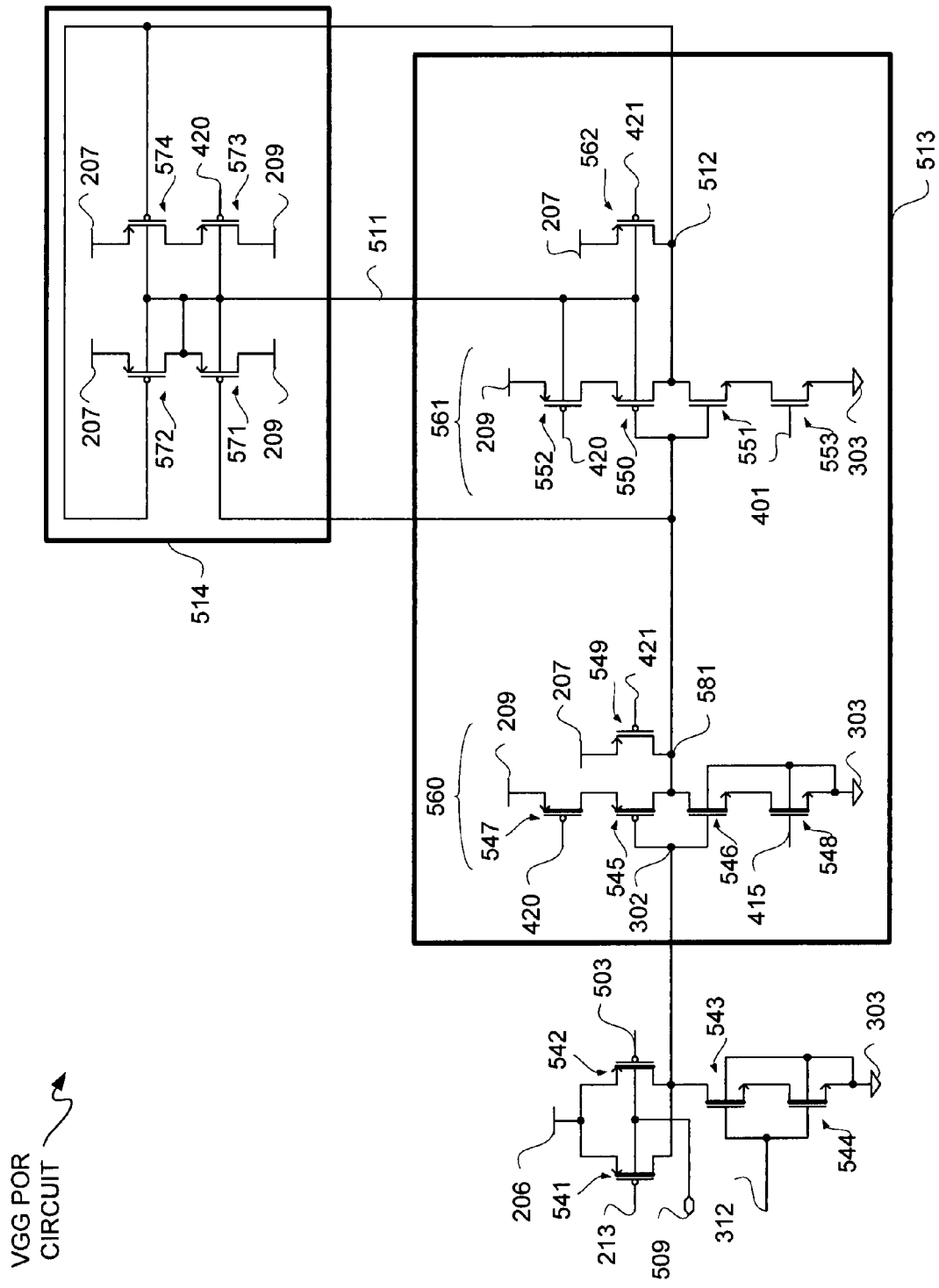

Additionally, with reference to FIGS. 5A and 5B, it should be understood that substrates of transistors, particularly N-wells for P-channel transistors, may be appropriately biased for a POR condition. In other words, if N-wells are not appropriately biased there may be a "sneak" path through such N-wells for current leakage as shall be appreciated from the following description. POR circuitry as described herein may be used to prevent or limit leakage current between power supplies for any of a variety of possible supply power conditions during POR, namely for all values that VCCAUX and VCCINT may attain during a POR condition. Additionally as described herein, N-wells may be biased for PMOS transistors during such a POR cycle to avoid such a "sneak" path.

Furthermore, logic for a suspend mode operation as previously described may be incorporated into the POR logic for purposes of silicon area savings. The POR circuit as described herein may be local to each voltage regulator such that the VCCINT path, namely the VCCINT path through P-channel transistor 205 of FIGS. 2 and 3, is shut off during a POR condition. In other words, sense voltage VS 215 may be maintained at a sufficiently high level through a POR cycle to place P-channel transistor 205 in a substantially conductive state. Local power down signal 312 during a POR condition may be maintained at a logic low state.

FIGS. 5A and 5B in combination are a circuit diagram depicting an exemplary embodiment of a VGG regulator 500. VGG regulator 500, which may be coupled to VGG POR logic 400 of FIG. 4 to receive POR_VGG signal 420 and POR_B_VGG signal 421 therefrom, may be used for an implementation of voltage regulator 200 of FIG. 2 or voltage regulator 300 of FIG. 3A with VGG POR circuit 203. With simultaneous reference to FIGS. 1, 2, 3, 4, 5A and 5B, voltage regulator 500 is further described.

VCCAUX 206 is used to power level-shifter circuit 521. Level-shifter circuit 521 may operate similarly to level shifter circuit 425 of FIG. 4. Level-shifter circuit 521 receives a global power down signal 212 and POR_B_VCCAUX signal 415 from FPGA fabric, namely programmable logic of an FPGA. There are three outputs of level-shifter circuit 521, one of which is not inverted with respect to global power down signal 212. The inverted outputs are enable_VDD signal 501 and enable_VCCAUX signal 502. The non-inverted output from level-shifter circuit 521 is enable_B_VCCAUX signal 503. Enable_VDD signal 501 is VCCINT-based logic high level logic, while the other two signals output from level-shifter circuit 521 are VCCAUX-based logic high level signals. In a POR condition, power down signal 212 is logic low. Thus enable_VCCAUX signal 502 is logic high and enable_B_VCCAUX signal 503 is logic low independent of supply POR condition. Enable_B_VCCAUX signal 503 is used to gate transistor 542 to pull node 302 high independent of voltage on VPG 213 in FIG. 5B during POR. In FIGS. 2 and 3, this is similar to pulling VPG 213 to a logic high voltage to turn OFF P-channel transistor 205 as previously described.

A pull-up P-gate signal 504, which may be generated from control logic, is input to inverters 522 and 523. Pull-up P-gate signal 504 received from the FPGA fabric may be a logic high level during a POR condition, and thus outputs of inverters 522 and 523 during a POR condition are both logic low.

Inverter 522 is powered using VCCAUX 206 and inverter 523 is powered using VGG 209. Output of inverter 522 is provided to a gate of P-channel transistor 524, and output of inverter 523 is provided to a gate of P-channel transistor 525. P-channel transistors 524 and 525 are source-drain coupled in series.

A source of P-channel transistor 524 is coupled to receive VCCAUX 206. A drain of P-channel transistor 525 is coupled to VPG 213. P-channel transistors 524 and 525 may be formed with a common N-well 509. Thus, during a POR condition when VCCINT 207 equals 0 volts and VCCAUX 206 is at a logic high voltage level and VGG 209 is any possible value, there is a possibility that P-channel transistor 205 is ON as its gate can be at zero volts. This is because P-channel transistor 205 gate logic is at a VCCINT 207 level during POR. However, VCCAUX 206 is coupled to VPG 213 via transistors 524 and 525. Signal 504 is a pull-up gate signal that is a VCCAUX level signal that is asserted during a SUSPEND mode and during a POR mode, and signal 504 is inverted by inverters 522 and 523 to generate gating signals for P-channel transistors 524 and 525. This shuts off P-channel transistor 529 (which is same as P-channel transistor 204) and prevents a sneak path from VCCAUX 206 to VCCINT 207. However, for VCCAUX 206 at zero volts, VPG 213 is pulled up to VGG 209 via P-channel transistor 530 to avoid or reduce leakage by shutting off such sneak path. When VCCAUX 206 is at zero volts, VCCINT 207 is at a logic high voltage level, and then independent of VGG 209 voltage, P-channel transistor 525 is shut-off as its drain and gate are at VGG and its source is at VCCAUX 206 which is zero volts. In this instance, VPG 213 is not coupled to VCCAUX 206. In this instance, VPG 213 is pulled up to VGG through P-channel transistor 530. Thus P-channel transistor 529 is turned OFF as its gate and drain are at VGG and its source is at VCCAUX 206 which is zero volts. This shuts-off VCCAUX 206 to VCCINT sneak paths as described below in additional detail.

VCCAUX 206 is provided as an input to inverter 526. Inverter 526 is powered using VGG 209. Output of inverter 526 is provided to a gate of P-channel transistor 527. A source of P-channel transistor 527 is coupled to VCCAUX 206. A drain and a body region of P-channel transistor 527 are coupled to N-well 509.

P-channel transistor 528 has its gate coupled to receive VCCAUX 206 and its source coupled to VGG 209. A drain and a body region of P-channel transistor 528 are coupled to N-well 509. P-channel transistors 527 and 528 may have a common drain. P-channel transistor 529 has its gate coupled to receive VPG 213. A source of P-channel transistor 529 is coupled to VGG 209, and a drain of P-channel transistor 529 is coupled to VCCAUX 206. A body region of P-channel transistor 529 is coupled to N-well 509.

P-channel transistor 530 has its gate coupled to receive VCCAUX 206 and its source coupled to receive VGG 209. A drain of P-channel transistor 530 is coupled to VPG 213. P-channel transistor 531 has a gate coupled to VPG 213, and source, drain, and body regions of P-channel transistor 531 are all commonly coupled to one end of a resistor 532. The other end of resistor 532 is coupled to VGG 209. Resistor 532 is optional and accordingly may be optioned out using a metal option during the fabrication of an integrated circuit device for VGG regulator 500. By optioning out resistor 532, resistor 532 may be bypassed such as by coupling the source, drain, and body regions of P-channel transistor 531 directly to VGG 209 to bypass resistor 532 or alternatively resistor 532 may be omitted for more directly coupling source, drain, and body regions of P-channel transistor 532 to VGG 209. P-channel transistor 531 and resistance 532 are used mainly for AMP 202 stability and frequency compensation, and depending on topology, they may or may not be used.

During a POR condition when VCCAUX 206 is at or approximately zero volts, VPG 213 may initially be zero volts. During this initial time interval of a POR condition and if these voltage levels exist, there is a possibility of a sneak path or current leakage path from VGG 209 to VCCAUX 206 source to drain through P-channel transistor 529 for example. During this time P-channel transistor 529 is back body biased by VGG 209 via P-channel transistor 528 to further shut off such sneak path.

Once VCCAUX 206 reaches a threshold voltage level, output of inverter 526 may be a logic low causing back body biasing of P-channel transistor 529 with VCCAUX 206, and P-channel transistors 528 and 530 may be in a substantially non-conductive state. Thus, it should be understood that N-well 509 is back body biased by either VGG 209 or VCCAUX 206. Additionally, once VPG 213 reaches a sufficient voltage level, namely one VTP above VGG 209, P-channel transistor 531 may be in a substantially non-conductive state. Furthermore, pull-up P-gate signal 504 may be a logic high level, coupling VCCAUX 206 to VPG 213 via P-channel transistors 524 and 525. NWELL bias circuits involving inverter 526, and P-channel transistors 527 and 528 is as described herein are for a POR mode.

Leakage shielding circuitry is generally formed of transistors 528 and 530 for avoiding or reducing supply to supply leakage in a POR condition. Transistor 531 may be more particularly useful to provide stability to AMP 202 in a normal or awake mode of operation. Thus, it should be understood that transistors 528 and 530 may be used for both a POR condition and when transitioning from a suspend mode to an awake mode, as VCCAUX 206 may initially be at approximately zero volts for such transition.

N-well 509 may be common with body regions of P-channel transistors 541 and 542. P-channels transistors 541 and 542 are coupled in source-drain parallel, where their sources are coupled to VCCAUX 206 and their drains are coupled to sense node 302. A gate of P-channel transistor 541 is coupled to receive VPG 213, and a gate of P-channel transistor 542 is coupled to receive enable B_VCCINT signal 503.

P-channel transistors 541 and 542 may both be substantially conductive during a POR condition and may be associated with P-channel transistor 314. Independent of state of P-channel transistor 541, P-channel transistor 542 is ON during POR as discussed previously with reference to level-shifter circuit 521. Again, during an initial part of a POR cycle, VPG 213 follows VCCAUX 206. If or when VPG 213 should rise to be within one VTP of VCCAUX 206, P-channel transistor 541 becomes at least substantially non-conductive; however, P-channel transistor 542 may remain substantially conductive during a POR condition as its gate is at logic low. In an awake mode, P-channel transistor 542 remains substantially conductive responsive to enable B_VCCAUX signal 503 being logic low. For a suspend mode, both signals 213 and 503 are logic high which respectively makes transistors 541 and 542 substantially non-conductive.

N-channel transistors 543 and 544 are coupled in source-drain series, and both of body regions of N-channel transistors 543 and 544 may be coupled to ground 303. Alternatively only one N-channel transistor of transistors 543 and 544 may be used, depending on process design rule checking ("DRC") and electro-static discharge ("ESD") rules. A source of N-channel transistor 544 is coupled to ground 303, and a drain of N-channel transistor 543 is coupled to sense node 302. Both gates of N-channel transistors 543 and 544 are coupled to receive power down signal 312. N-channels transistors 543 and 544 may be associated with N-channel transistor 315.

The following paragraphs, a POR buffer, namely VGG driver logic 513, is described in additional detail. During a POR condition, the POR buffer is activated to send correct logic levels to prevent current paths between supplies. In normal mode or a suspend mode of operation, the POR buffer is transparent and just used to level-shift signal 302 from a VCCAUX level to a VCCINT level. This level-shifting is used as VCCAUX 206 and VCCINT 207 are at significantly different levels. If VCCAUX 206 and VCCINT 207 are not at significantly different levels but are quite similar in levels, the level-shifter may be omitted as illustratively shown in FIG. 7.

In the following description, buffers are powered with VGG 209 and use POR_VGG and POR_B_VGG levels, because VGG 209 is significantly different from VCCINT 207 after POR. These VGG level signals may be replaced with VCCINT level signals, if VGG 209 is less than or comparable to VCCINT 207 in a normal mode of operation, because outputs or output nodes 581 and 512 of the POR buffer are at VCCINT levels during a POR condition, as described below in additional detail with reference to FIG. 7.

VGG driver logic 513 may include inverters coupled in series with a pull-up P-channel transistor 549 coupled therebetween. An inverter formed of P-channel transistor 545 and N-channel transistor 546 is coupled on an input side at sense node 302 which may be associated with VS 215. An output side of such inverter provides power_down_VGG signal, sourced from output node 581, responsive to VS 215. A source of P-channel transistor 545 is coupled to a drain of P-channel transistor 547. A source of P-channel transistor 547 is coupled to VGG 209, and a gate of P-channel transistor 547 is coupled to receive POR_VGG signal 420. A source of N-channel transistor 546 may be coupled to a drain of N-channel transistor 548, and a source of N-channel transistor 548 may be coupled to ground 303. Body regions of N-channel transistors 546 and 548 may be coupled to ground 303. A gate of N-channel transistor 548 is coupled to receive POR_B_VCCAUX signal 415. POR_VGG and its complement may be replaced with VCCINT level signals if VGG 209 is not significantly different from VCCINT 207 during a normal mode of operation, as described below in additional detail with reference to FIG. 7.

The output node of the inverter formed of drains of transistors 545 and 546 may be coupled to P-channel transistor 549 at a drain thereof. A source of P-channel transistor 549 may be coupled to VCCINT 207, and P-channel transistor 549 may be gated with POR_B VGG signal 421. The output of the inverter formed of transistors 545 and 546 is coupled to another inverter of VGG driver logic 513, as well as to VCCINT NWELL logic and VCCINT path shutoff logic 514.

The other inverter of VGG driver logic 513 is formed using P-channel transistor 550 and N-channel transistor 551 to form an inverter having an input node coupled to the output node of the inverter formed using transistors 545 and 546. N-channel transistor 551 has its source coupled to the drain of N-channel transistor 553, and the source of N-channel transistor 553 is coupled to ground 303. A gate of N-channel transistor 553 is coupled to receive POR_B signal 401. A source of P-channel transistor 550 is coupled to a drain of P-channel transistor 552, and a source of P-channel transistor 552 is coupled to VGG 209. A gate of P-channel transistor 552 is coupled to receive POR_VGG signal 420. An output node of the inverter formed of transistors 550 and 551 is used to source power-_down_B_VGG signal 512.

For purposes of clarity and not limitation, transistors 545 through 548 are hereinafter referred to as inverter 560, and transistors 550 through 553 are hereinafter referred to as inverter 561. Output of inverter 560, which is provided to an input of inverter 561, is also provided as an input to VCCINT NWELL logic and VCCINT path shutoff logic 514.

Output of inverter 561 may be coupled to a drain of P-channel transistor 562 which is sourced from VCCINT 207. A gate of P-channel transistor 562 may be coupled to receive POR-_B_VGG signal 421.

During a POR condition, POR_VGG signal 420 is logic high, and POR_B_VCCAUX signal 415 and POR_B_VGG signal 421 are logic low. Thus, inverter 560 is electrically decoupled from power and ground, namely inverter 560 is tri-stated, and output of inverter 560 is pulled up via P-channel transistor 549 to VCCINT 207. This pull-up voltage on the output of inverter 560 avoids a floating condition to provide a known state. It should be understood that because inverter 560 is tri-stated during a POR condition, P-channel transistor 547 is OFF during POR and hence there is no sneak path through inverter 560 for cross-coupling of supply voltages. In addition, there is no electrically conductive path between sense node 302 and output node 581 via inverter 560.

After a POR cycle, POR_VGG signal 420 is logic low, and POR_B_VCCAUX signal 415 and POR_B_VGG signal 421 are logic high. Thus, inverter 560 is powered up for suspend and awake modes, and P-channel transistor 549 is substantially non-conductive. It should be understood that during operation input to inverter 560 may be VCCAUX-based logic high voltage and output therefrom may be VGG-based logic high voltage.

During a POR condition, POR_VGG signal 420 is logic high, and POR_B signal 401 and POR_B_VGG signal 421 are logic low. Thus, inverter 561 is likewise tri-stated during a POR condition. Output of inverter 561 is pulled-up by P-channel transistor 562 to VCCINT 207 during a POR condition.

After a POR cycle, POR_VGG signal 420 is logic low, and POR_B signal 401 and POR_B_VGG signal 421 are logic high. Thus, inverter 560 is powered up for suspend and awake modes, and P-channel transistor 562 is substantially non-conductive.

The following paragraphs, a VCCINT NWELL bias and a VCCINT path, namely VCCINT NWELL logic and VCCINT path shutoff logic 514, are described in additional detail. During a POR condition, inputs from VGG driver logic 513 to VCCINT NWELL logic and VCCINT path shutoff logic 514 are both VCCINT 207 pulled-up voltages via P-channel transistors 549 and 562, respectively. VCCINT path shutoff logic 514 includes P-channel transistors 571 through 574. P-channel transistors 572 and 574 are sourced from VCCINT 207, and P-channel transistors 571 and 573 are sourced from VGG 209. P-channel transistors 571 and 572 are coupled in source-drain series, and P-channel transistors 573 and 574 are likewise coupled in source-drain series. Gates of P-channel transistors 572 and 574 are coupled to receive voltage at an output node of inverter 561. A gate of P-channel transistor 571 is coupled to receive voltage at an output node of inverter 560. A gate of P-channel transistor 573 is coupled to receive POR-_VGG signal 420.

Generally for a POR condition, transistors 571 through 574 may be designed to be gated with a highest available voltage level to prevent or reduce leakage between VGG 209 and VCCINT 207. In POR inverter and buffer stages, voltage at N-well 511 and output node 512 are at VCCINT-levels, while POR_VGG signal 420 is at a VGG level. Table 3 indicates states of N-well 511 for logic levels of VGG 209 and VCCINT 207.

TABLE 3

| VGG 209 | VCCINT 207 | N-WELL 511 |
|---------|------------|------------|
| 0 | 0 | 0 |
| 0 | 1 | Floating |
| 1 | 0 | VGG |
| 1 | 1 | Floating |

For example, N-well 511 is floating when VGG 209 is at a logic low level and VCCINT is at a logic high level because all P-channel transistors 571 through 574 of VCCINT NWELL logic and VCCINT path shutoff logic 514 are OFF. For VCCINT 207 being at a logic low level and N-well 511 at VGG, it should be understood that the logic high level for VGG 209 indicated in Table 3 may be an intermediate value, as previously described.

By preventing or reducing leakage between VGG 209 and VCCINT 207, effectively this means preventing or reducing leakage between VCCAUX 206 and VCCINT 207, as VGG 209 is derived from one of these two supplies. N-well 511 may be biased to the highest available voltage during a POR condition. If VCCINT 207 and VGG 209 are equal to logic low voltage, N-well 511 is at logic low voltage. When VGG is at a logic high voltage and VCCINT is at a logic low voltage, N-well 511 is at a VGG level and in addition P-channel transistors 571 and 572 gates are at a VCCINT level and thus both of those transistor are ON. As long as voltage of VGG 209 during this condition is less than a VTP of transistors 571 and 572, there is no sneak path. This is because the p-channel transistor 204, which is associated with p-channel transistor 529, will shutoff as previously described and prevent a sneak path between VCCAUX 206 and VCCINT 207.

If VCCINT is at a logic high and VGG 209 is logic low voltage, then P-channel transistors 571, 572, 573, and 575 are OFF and N-well 511 is floating. N-well 511 eventually charges up to VCCINT which is the largest available voltage. For these POR supply conditions, N-well 511 is biased to a highest available voltage and no path between VCCAUX 206 and VCCINT 207 is created. If VGG 209 and VCCINT 207 are both at a logic high voltage during a POR, N-well 511 is floating as both of P-channel transistors 571 and 572 are OFF.

P-channel transistor 573 is used to prevent a path between VCCAUX 206 and VCCINT 207 through VGG 209. When VCCINT 207 is at a logic low voltage and VCCAUX 206 is at a logic high voltage, there is a possibility that VGG 209 may be charged to an intermediate value. In this instance, P-channel transistor 574 gate is at a VCCINT level and thus is ON. This state of P-channel transistor 574 causes a transient current path between VCCAUX 206 and VCCINT 207 through VGG 209 until VCCINT 207 rises or VGG 209 drops off. P-channel transistor 573 is in series with P-channel transistor 574, and P-channel transistor 573 is gated by POR_VGG, so P-channel transistor 573 will shut off and hence will prevent the transient path.

During a POR condition, POR_VGG signal 420 is logic low, and POR_B_VGG signal 421 is logic high. Thus, outputs from VGG driver logic 513 are both pulled up to VCCINT 207, as previously described. Transistors 571 and 572 are for biasing N-well 511. N-well 511 is coupled to the drains of transistors 571 and 572. Thus, depending on which of VCCINT 207 and VGG 209 is higher, that higher voltage is coupled to N-well 511 via P-channel transistors 572 and 571, respectively. Transistors 573 and 574 form a clamp, which is shut off during POR. Thus, N-well 511 is coupled to the higher one of VGG 209 and VCCINT 207, or left floating during POR. N-well 511 may be common to all of transistors 550, 552, 562, and 571 through 574.

After a POR cycle, in an awake mode or a suspend mode, POR_VGG signal 420 is logic high, and VGG driver logic 513 inverter outputs are at opposite states. Accordingly, P-channel transistor 573 may be substantially conductive, and either or both of transistors 572 and 574 may be substantially conductive and transistor 571 may be substantially nonconductive in a suspend mode, or both of transistors 572 and 574 may be substantially nonconductive and transistor 571 may be substantially conductive in an awake mode. For an awake mode, VS 215 is logic high, so output of inverter 560 is logic low and output of inverter 561 is logic high. Thus, N-well 511 is coupled to VGG 209 via transistor 571, which may be higher than VCCINT 207 during an awake mode. During a suspend mode, VS 215 is logic low, so output of inverter 560 is logic high and output of inverter 561 is logic low. Thus, N-well 511 is coupled to VCCINT 207 via transistor 572, which may be higher than VGG 209 during a suspend mode. Accordingly, by either or both voltage clamping and N-well biasing, supply to supply charge leakage, or leakage current, is reduced or avoided.

It should be understood that VGG POR circuit 203 of FIG. 2 may be implemented VGG POR logic 400 of FIG. 4, VGG driver logic 513 of FIG. 5B, and VCCINT NWELL logic and VCCINT path shutoff logic 514 of FIG. 5B, along with miscellaneous circuitry as described with reference to FIG. 5A.

FIG. 6 is a circuit diagram depicting an alternative exemplary embodiment of an N-well and transistor circuit 600 having an N-well 509A, which may replace N-well 509 and associated circuitry of FIG. 5A.

Figure 7:
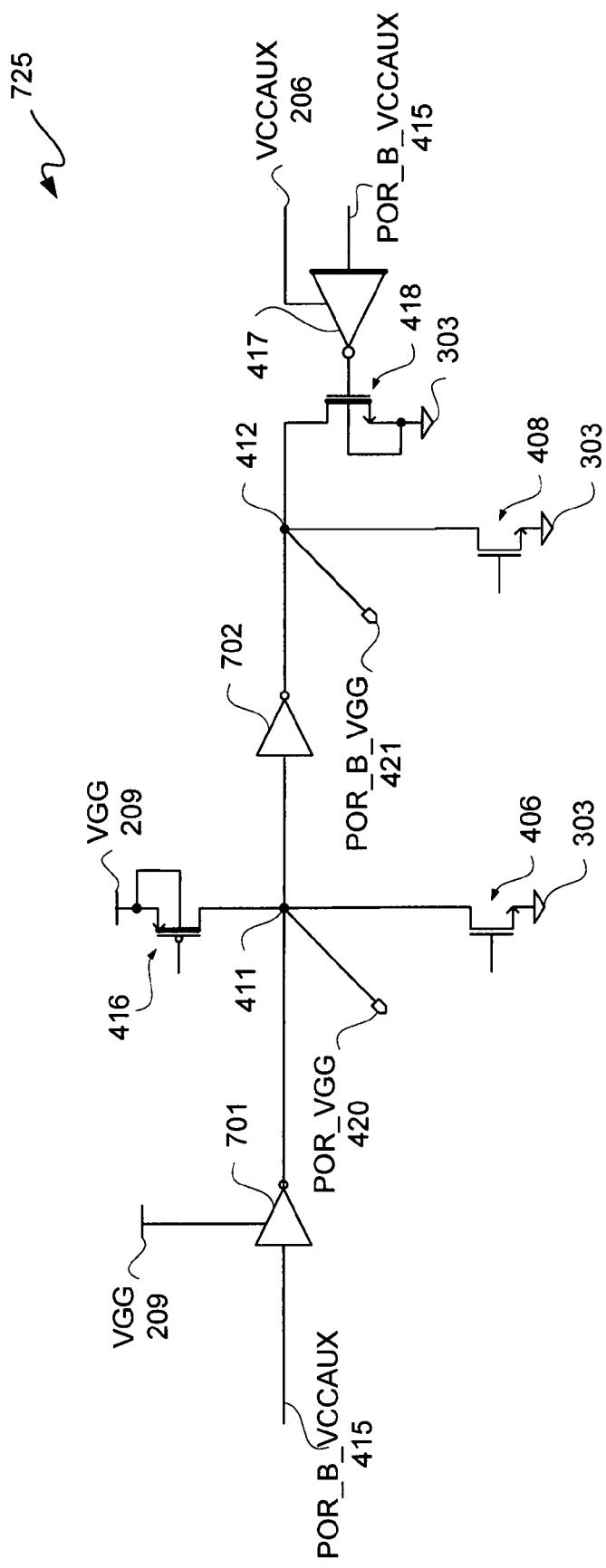
FIG. 7 is a circuit diagram depicting an alternative exemplary embodiment of a level-shifter circuit, which may replace a level-shifter circuit of FIG. 4.

FIG. 7 is a circuit diagram depicting an alternative exemplary embodiment of a level-shifter circuit 725, which may replace level-shifter circuit 425 of FIG. 4. Inverters 701 and 702 respectively replace cross-coupled transistors 414 and 413. This embodiment is suitable for when VGG 209 has a logic high voltage level approximately equal to that of VCCINT 207 in a normal (or an awake) mode of operation.

FIG. 8 is a circuit diagram depicting an alternative exemplary embodiment of inverters 860 and 861 of a POR buffer 800, which may respectively replace inverters 560 and 561 of FIG. 5B. In this embodiment POR_VDD signal 820 and POR_B_VDD signal 821 respectively replace signals 420 and 421 of FIG. 5B. This embodiment is may be useful when voltage level of VGG 209 is approximately equal to that of VCCINT 207 in a normal (or an awake) mode of operation.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, specific examples of N-channel and P-channel transistors were described, but as is well known N-channel and P-channel transistors may be exchanged for one another with an inversion in signal logic. Moreover, specific numerical examples of voltages were used for purposes of clarity; however, circuits described herein may be used with different voltages that the specific examples described, including voltages that scale down with transistor sizes. Claim(s) listing steps do not imply any order of the steps. Trademarks are the property of their respective owners.

What is claimed is:

1. A voltage regulator, comprising:
a driver circuit including a first inverter, a second inverter, a first output transistor, and a second output transistor;
the first inverter and the second inverter each being tri-stated during a power-on reset mode;
the first inverter and the second inverter each function as buffers during a suspend mode and an awake mode;
the first output transistor coupled to a first output node of the driver circuit;
the first output node being of the first inverter;
the second output transistor coupled to a second output node of the driver circuit, the second output node being of the second inverter;
the first inverter and the second inverter powered in association with a first voltage;
the first output transistor and the second output transistor powered in association with a second voltage;
the first voltage provided using either a first supply or a second supply;
neither the first supply nor the second supply being ground;
the second voltage provided using the second supply; and
the first output transistor and the second output transistor each configured for being substantially conductive during the power-on reset mode.

2. The voltage regulator according to claim 1, wherein the first voltage and the second voltage are the same.

3. The voltage regulator according to claim 1, further comprising:
the first voltage provided using the first supply during the awake mode;
the first voltage provided using the second supply during the suspend mode;
the first voltage provided using the second supply during the power-on reset mode before reaching an intermediate voltage between zero volts and an upper voltage level of the second supply;
the first voltage provided using the first supply during the power-on reset mode after reaching the intermediate voltage;
the first voltage reaching the upper voltage level of the second supply using the first supply during the power-on reset mode; and
an upper voltage level of the first supply being greater than the upper voltage level of the second supply.

4. The voltage regulator according to claim 1, further comprising: a well-bias circuit coupled to the first output node and the second output node and configured to couple a higher of the first voltage and the second voltage to a common N-well during the power-on reset mode.

5. The voltage regulator according to claim 1, further comprising:
the first inverter having a first P-channel transistor and a second P-channel transistor coupled in source-drain series;
a source node of the first P-channel transistor coupled to receive the first voltage;
a drain node of the second P-channel transistor coupled to the first output node;
gates of the first P-channel transistor and the second P-channel transistor respectively coupled to a first input node and a second input node of the first inverter;
the first inverter further having a first N-channel transistor and a second N-channel transistor coupled in source-drain series;
a source node of the first N-channel transistor coupled to receive a ground potential;
a drain node of the second N-channel transistor coupled to the first output node;
gates of the first N-channel transistor and the second N-channel transistor respectively coupled to a third input node and the second input node of the first inverter;
a source node of the first output transistor coupled to receive the second voltage;
a drain node of the first output transistor coupled to the first output node;
the second inverter having a third P-channel transistor and a fourth P-channel transistor coupled in source-drain series;
a source node of the third P-channel transistor coupled to receive the first voltage;
a drain node of the fourth P-channel transistor coupled to the second output node;
gates of the third P-channel transistor and the fourth P-channel transistor respectively coupled to a first input node and a second input node of the second inverter;
the second inverter further having a third N-channel transistor and a fourth N-channel transistor coupled in source-drain series;
a source node of the third N-channel transistor coupled to receive the ground potential;
a drain node of the fourth N-channel transistor coupled to the second output node;
gates of the third N-channel transistor and the fourth N-channel transistor respectively coupled to a third input node and the second input node of the second inverter;
a source node of the second output transistor coupled to receive the second voltage;
a drain node of the second output transistor coupled to the second output node;
a gate of each of the first P-channel transistor and the third P-channel transistor coupled to receive first power-on-reset control signaling having a first voltage level associated with the first voltage;
a gate of the first N-channel transistor coupled to receive second power-on-reset control signaling having a second voltage level associated with the first supply;
a gate of the third N-channel transistor coupled to receive third power-on-reset control signaling having a third voltage level associated with the second supply; and
a gate of each of the first output transistor and the second output transistor coupled to receive fourth power-on-reset control signaling having the first voltage level associated with the first voltage; and
the fourth power-on-reset control signaling having an opposite logic state with respect to the first power-on-reset control signaling.

6. The voltage regulator according to claim 5, wherein:
gates of the first P-channel transistor and the third P-channel transistor are coupled to the first output port to receive the first power-on-reset control signaling;
gates of the first output transistor and the second output transistor are coupled to the second output port to receive the fourth power-on-reset control signaling; and
the first power-on-reset control signaling and the fourth power-on-reset control signaling are provided from a level shifter.

7. The voltage regulator according to claim 6, wherein the voltage regulator is implemented in a programmable logic device.

8. The voltage regulator according to claim 1, further comprising a voltage clamping circuit, the voltage clamping circuit including:

a level shifter circuit having a third output node and a fourth output node;

the third output node coupled to the first inverter and the second inverter;

the fourth output node coupled to the first output transistor and the second output transistor;

clamp logic coupled to the level shifter circuit;

the clamp logic coupled to receive a first control signal and in response provide a clamp-on signal and a clamp-off signal;

the clamp logic being powered using the second voltage from the second supply;

the clamp logic configured to provide the clamp-on signal and the clamp-off signal to be in opposite logic states;

the clamp logic configured to provide the clamp-on signal to gate a first N-channel transistor of the level shifter circuit and to provide the clamp-off signal to a gate of a second N-channel transistor of the level shifter circuit;

the first N-channel transistor coupled to the third output node for selectively electrically decoupling and coupling the third output node to a ground potential or a regulated voltage responsive to the clamp-on signal;

the regulated voltage being the first voltage; and the second N-channel transistor coupled to the fourth output node for selectively electrically coupling and decoupling the fourth output node to the ground potential or the regulated voltage.

* * * * *